(12) United States Patent
Arakawa

(10) Patent No.: US 8,691,637 B2
(45) Date of Patent: Apr. 8, 2014

(54) SOLID-STATE IMAGE PICKUP DEVICE AND METHOD OF MANUFACTURING SAME

(75) Inventor: Shinichi Arakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 241 days.

(21) Appl. No.: 13/335,030

(22) Filed: Dec. 22, 2011

(65) Prior Publication Data

US 2012/0115270 A1 May 10, 2012

Related U.S. Application Data

(62) Division of application No. 12/372,857, filed on Feb. 18, 2009, now Pat. No. 8,120,684.

(30) Foreign Application Priority Data

Mar. 5, 2008 (JP) .................................. 2008-054560

(51) Int. Cl.
*H01L 21/82* (2006.01)

(52) U.S. Cl.
USPC ............... 438/144; 438/60; 438/75; 438/145; 257/E31.054

(58) Field of Classification Search
USPC ............... 257/E31.054; 438/60, 75, 144, 145
See application file for complete search history.

(56) References Cited

U.S. PATENT DOCUMENTS

2007/0249113 A1* 10/2007 Grudowski et al. ........... 438/199

FOREIGN PATENT DOCUMENTS

| JP | 03-011753 | 1/1991 |
| JP | 2005-286341 | 10/2005 |
| JP | 2005-311058 | 11/2005 |
| JP | 2006-216615 | 8/2006 |
| WO | 2005-064680 A1 | 7/2005 |

OTHER PUBLICATIONS

Japanese Office Action for JP Application No. 2008-054560 dated Nov. 6, 2012.
T. Ohguro et al.; The impact of oxynitride process, deueterium annealing and STI stress to 1/f noise of 0.11 um CMOS; 2003 Symposium on VLSI Technology Digest of Technical Papers.
Shgenobu Maeda et al.; Impact of Mechanical Stress Engineering on Flicker Noise Characteristics; 2004 Symposium on VLSI Technology Digest of Technical Papers.

* cited by examiner

*Primary Examiner* — Minchul Yang
(74) *Attorney, Agent, or Firm* — Dentons US LLP

(57) ABSTRACT

Disclosed herein is a solid-state image pickup device including: a photoelectric conversion section configured to convert incident light into a signal charge; a transfer transistor configured to read the signal charge from the photoelectric conversion section and transfer the signal charge; and an amplifying transistor configured to amplify the signal charge read by the transfer transistor, wherein a compressive stress film having a compressive stress is formed on the amplifying transistor.

3 Claims, 31 Drawing Sheets

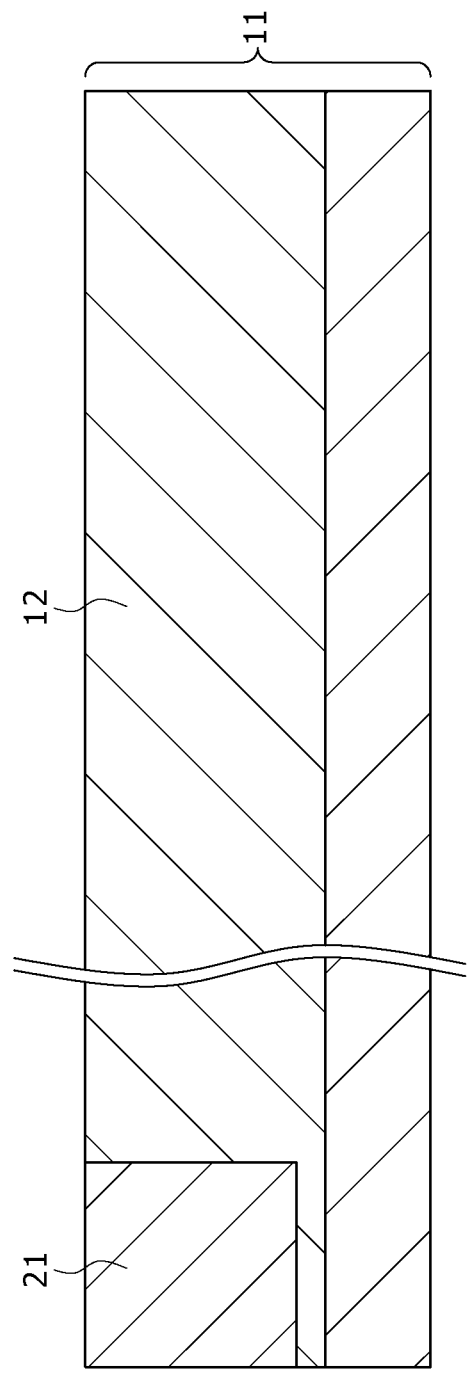

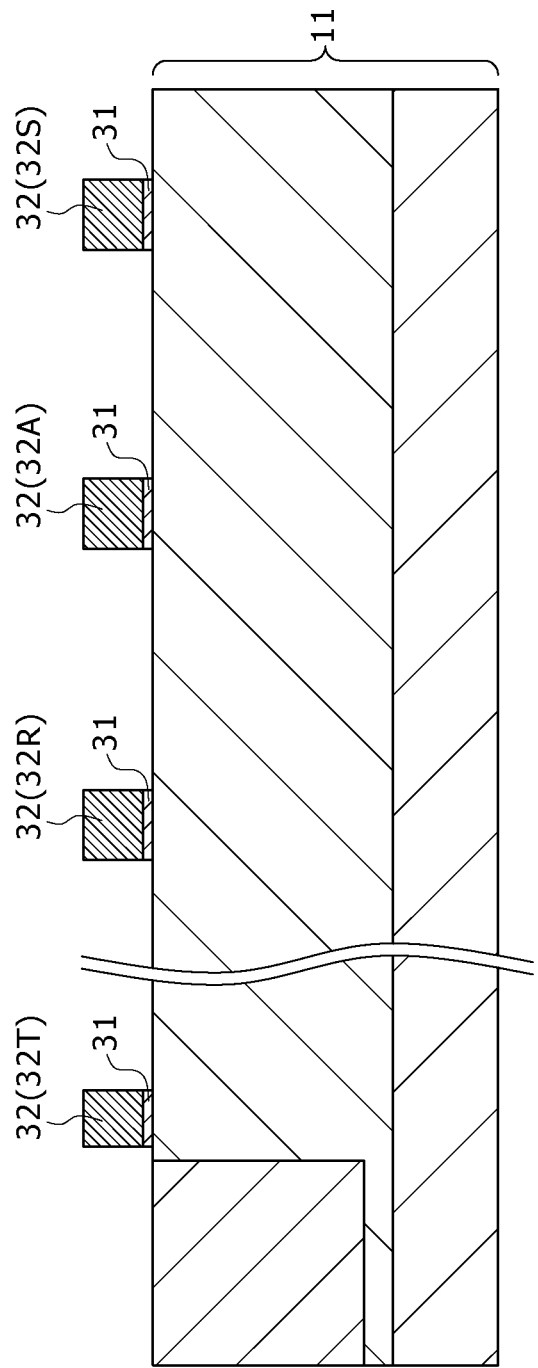

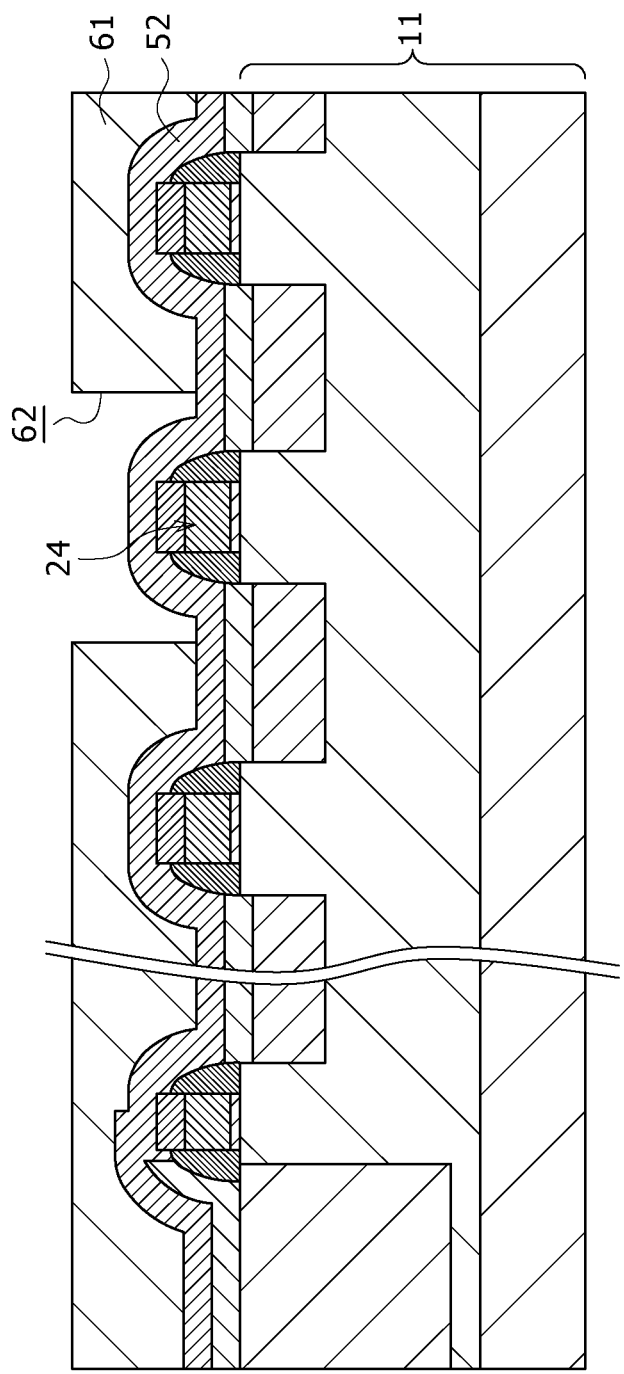

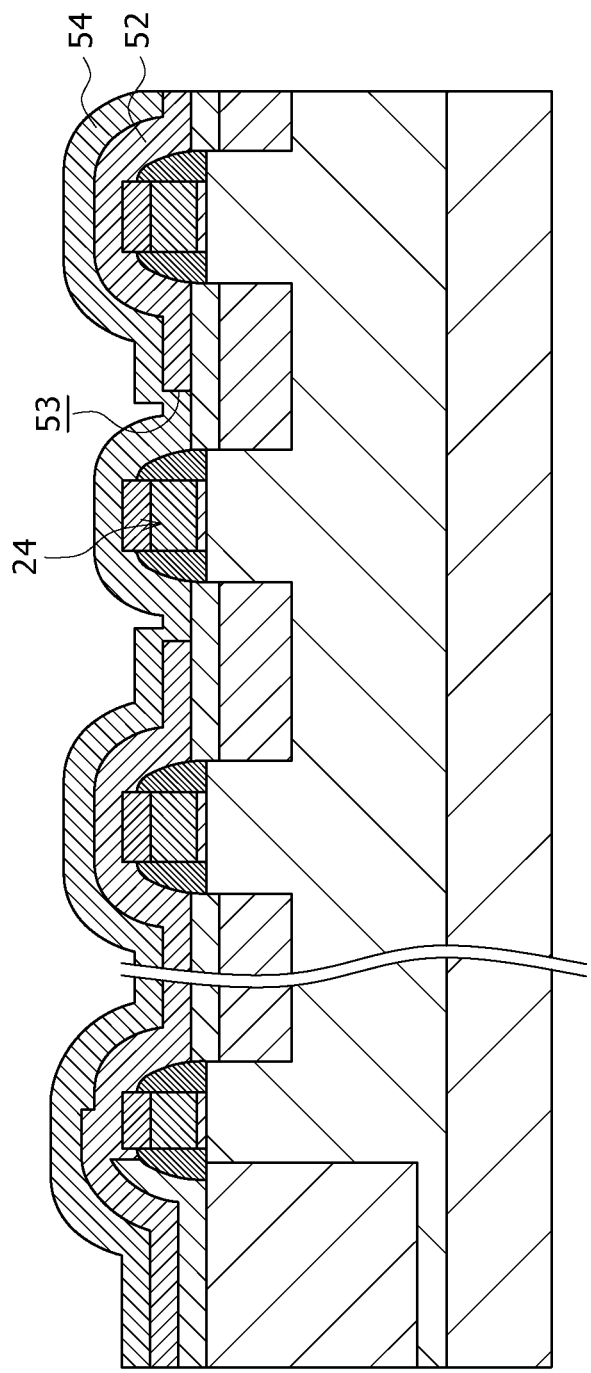

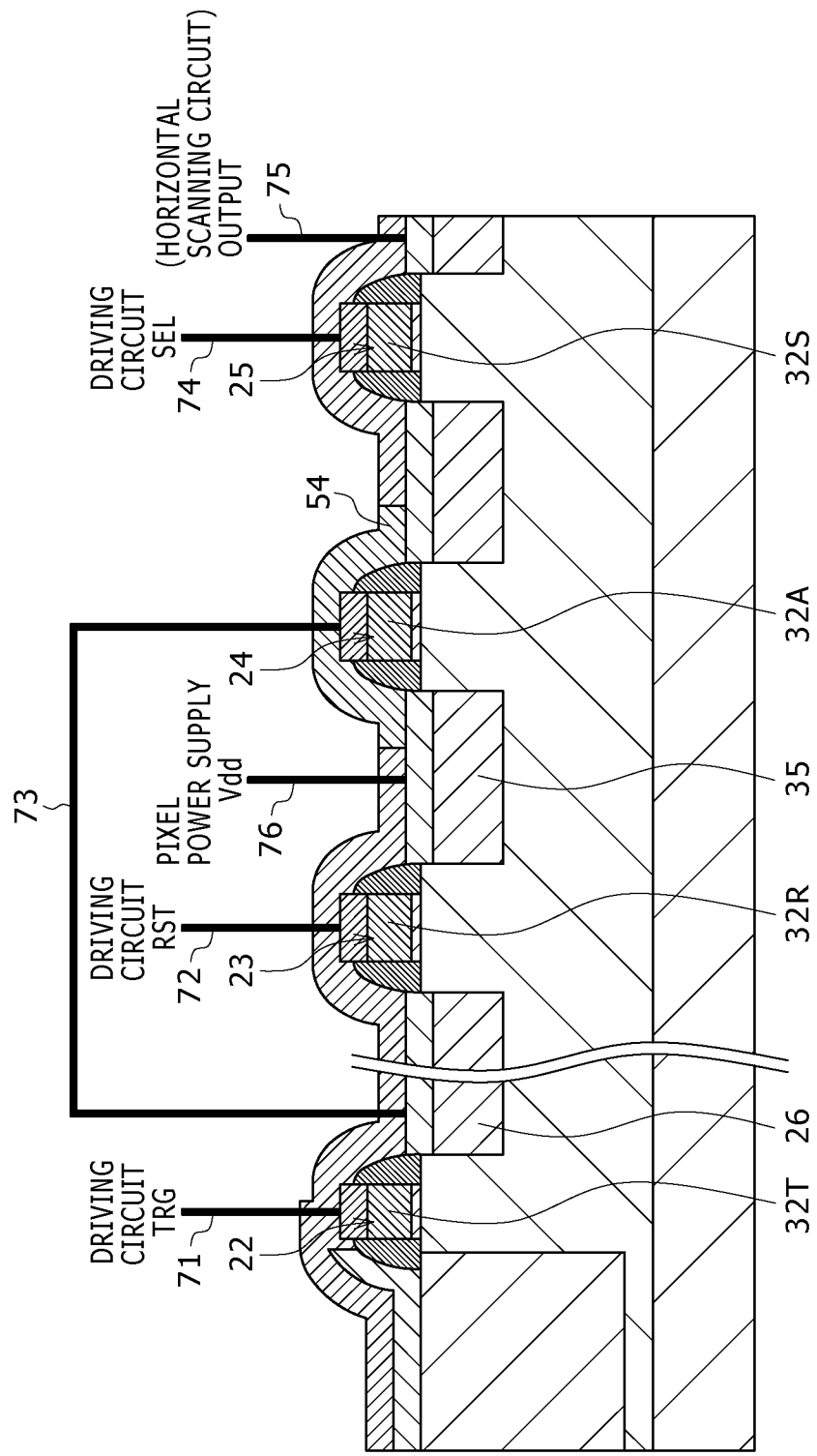

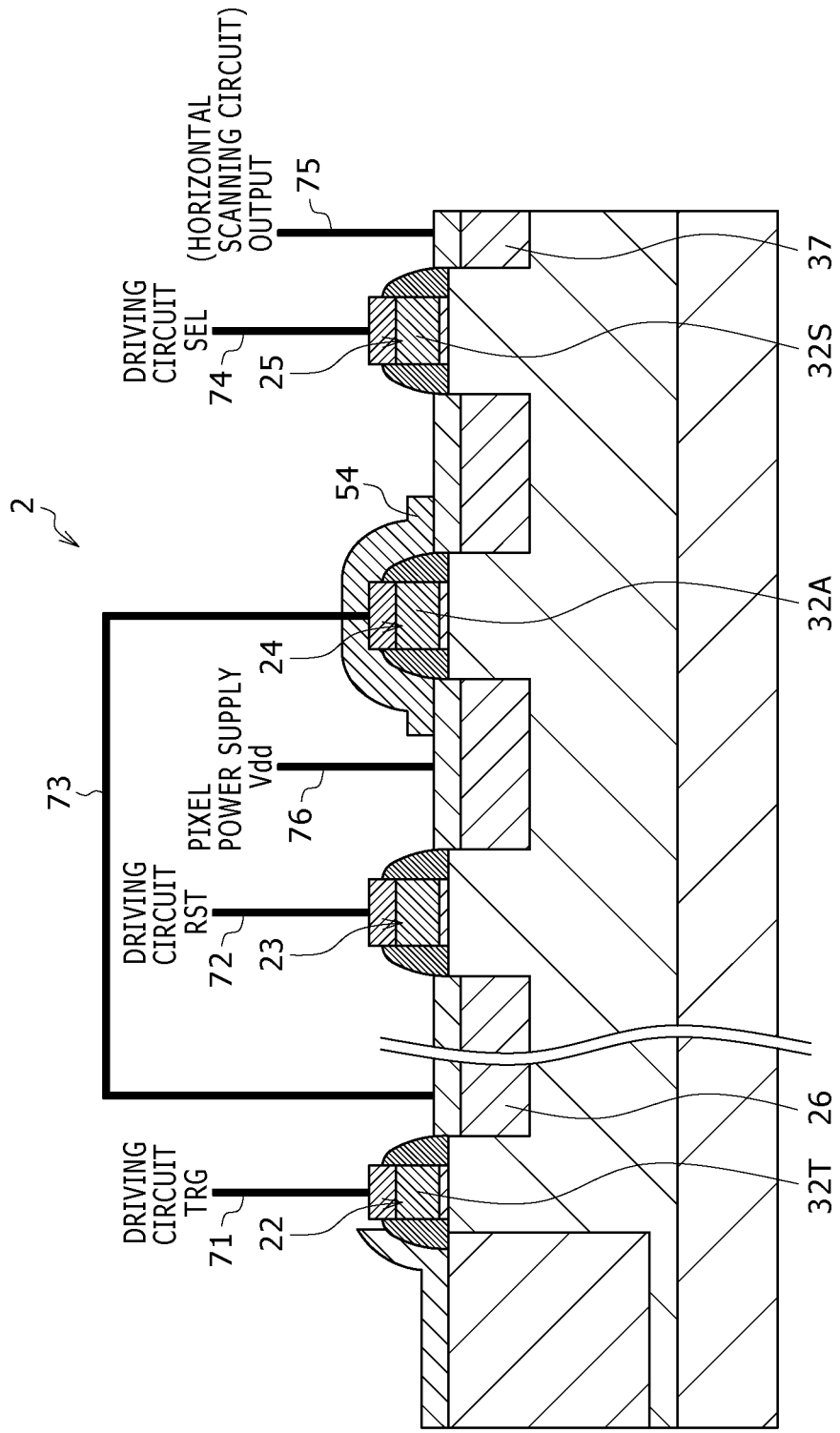

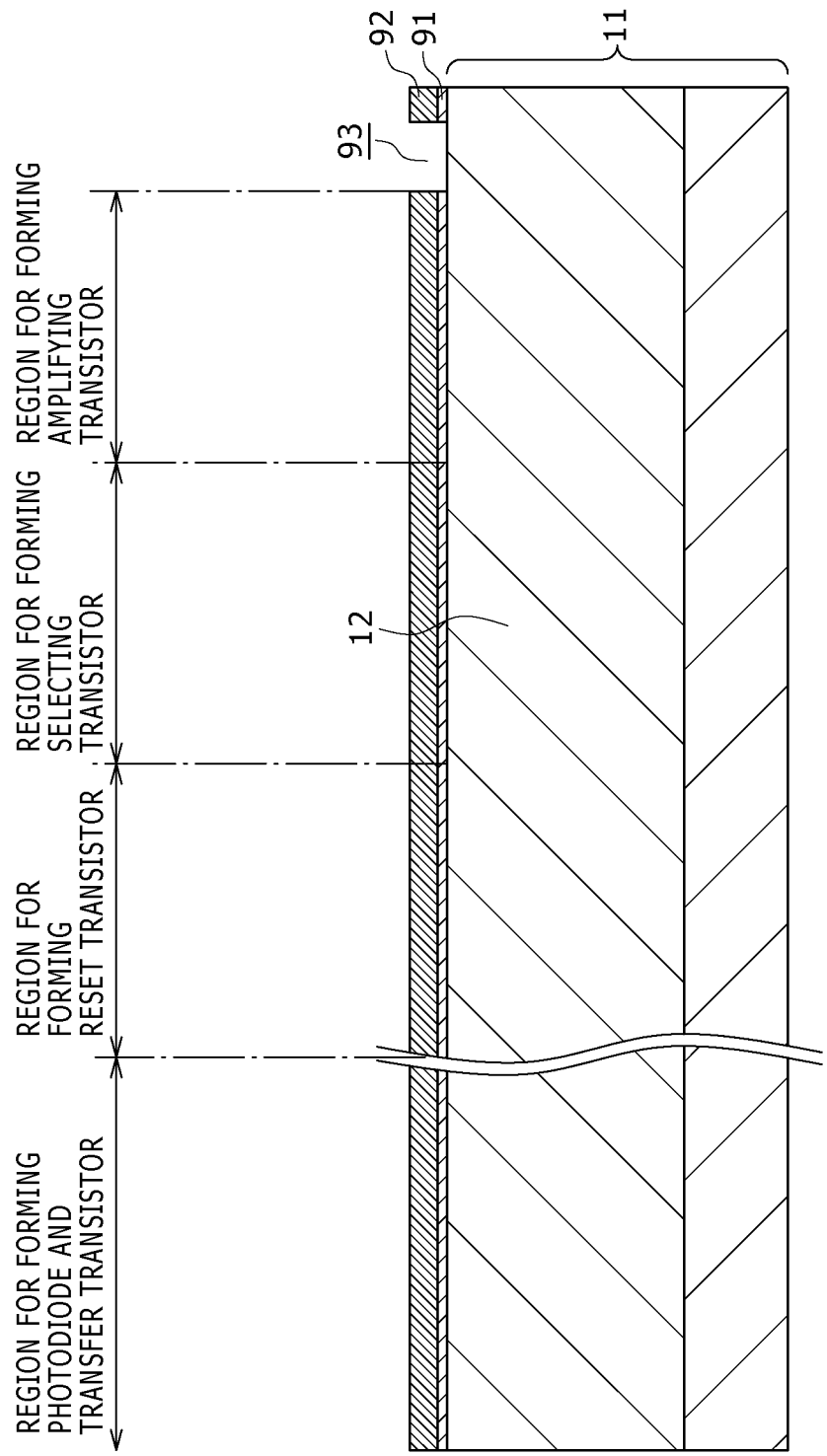

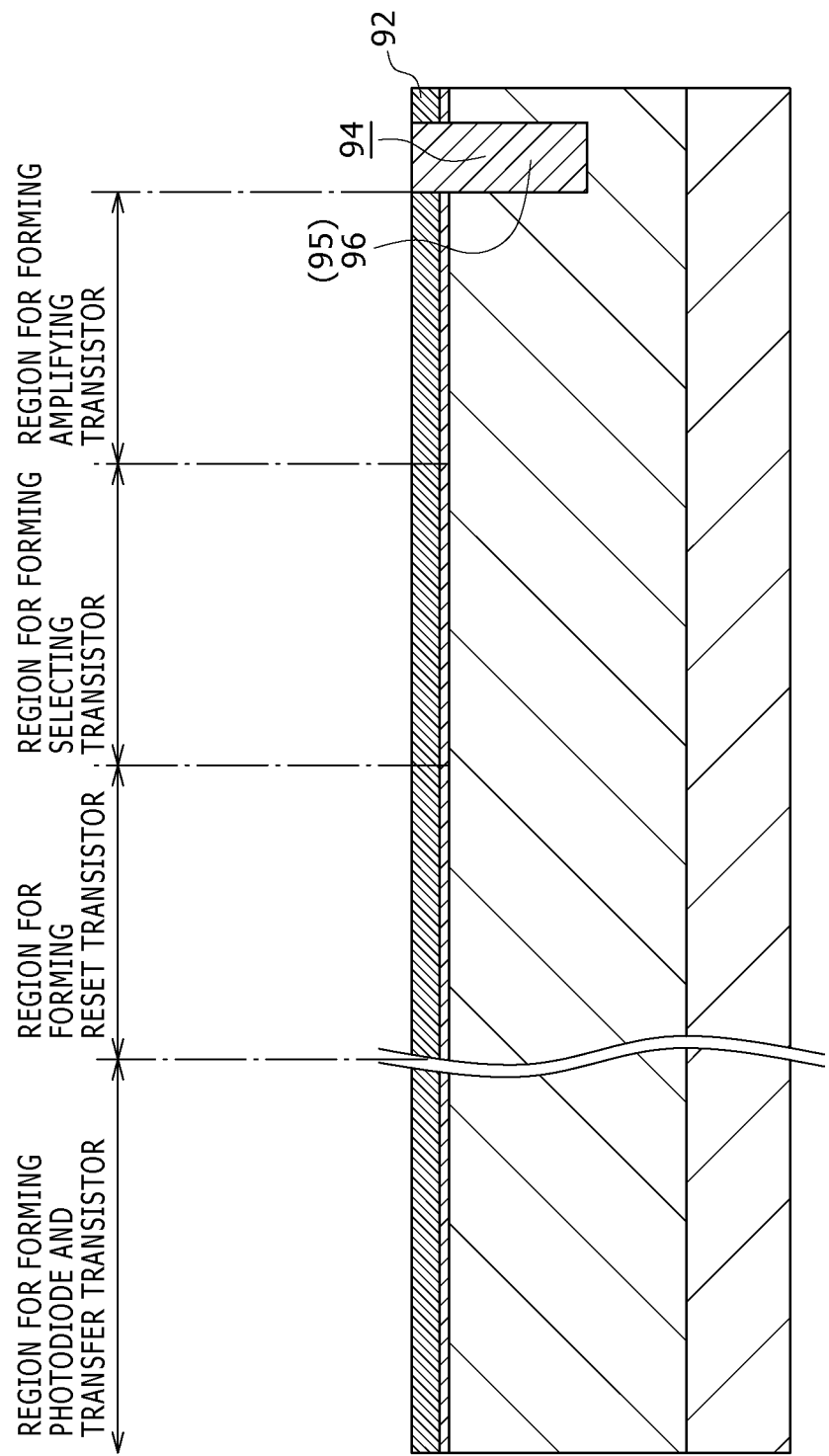

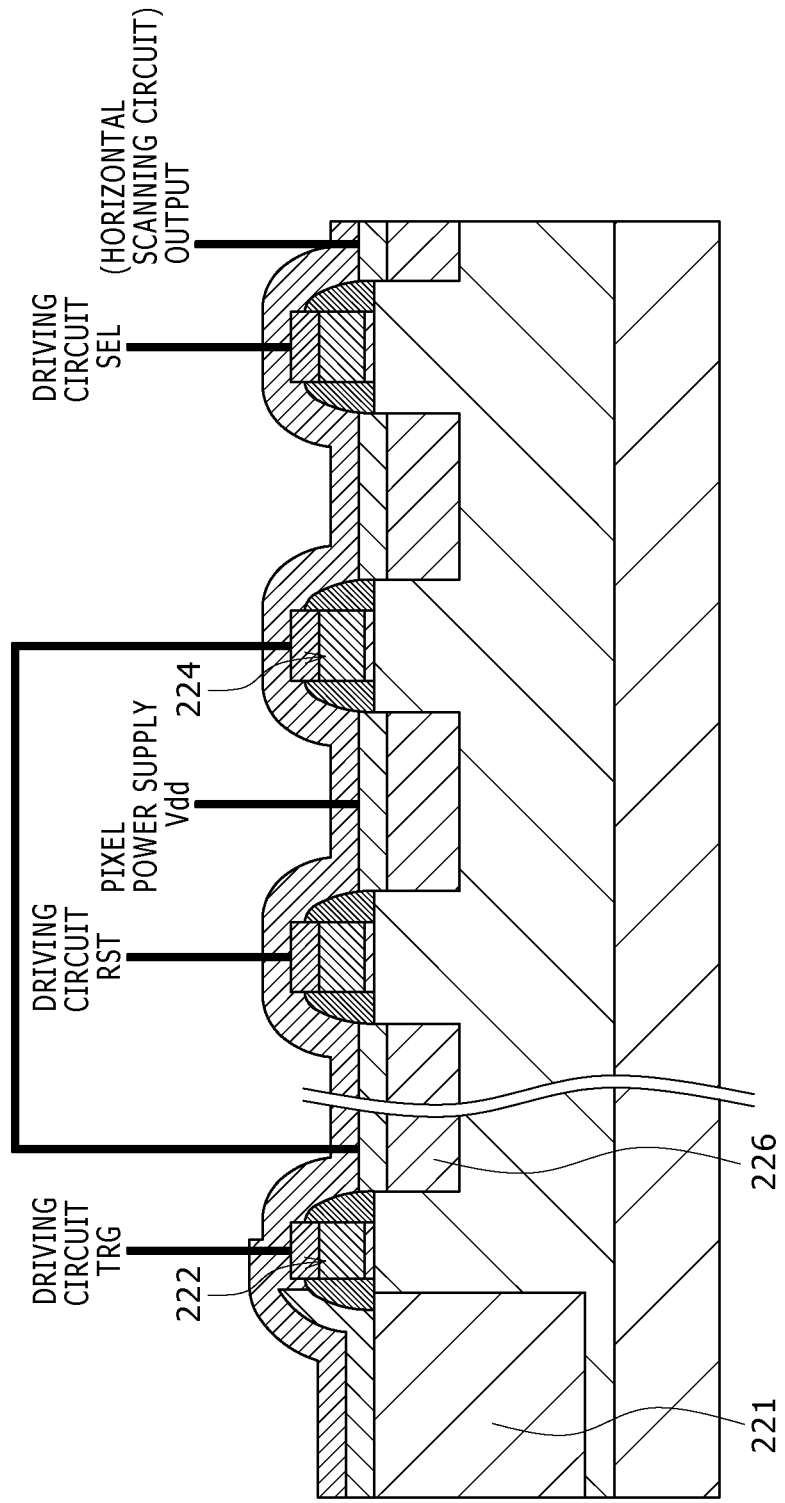

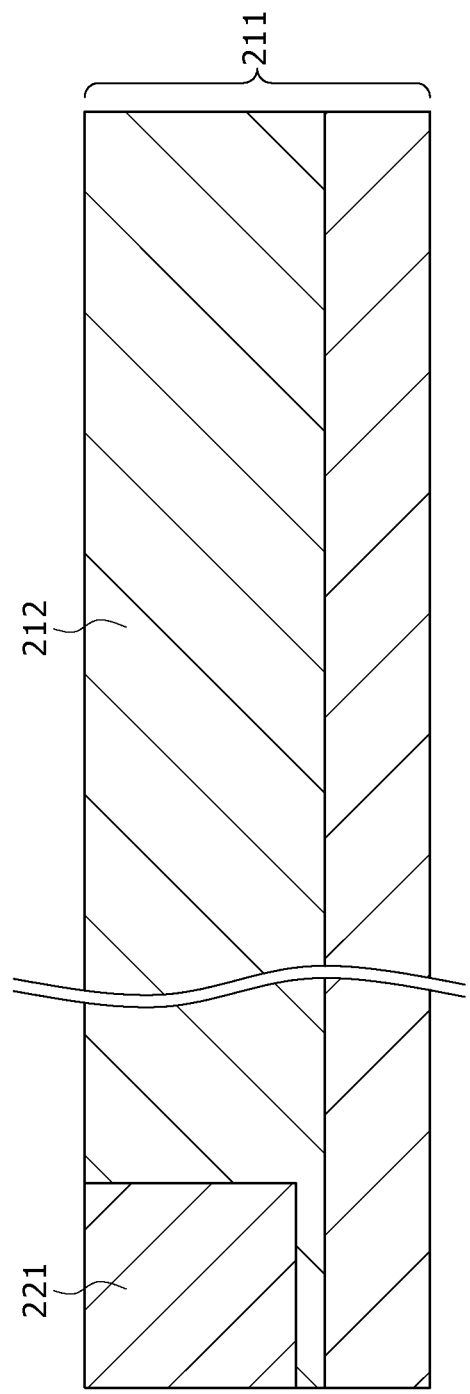

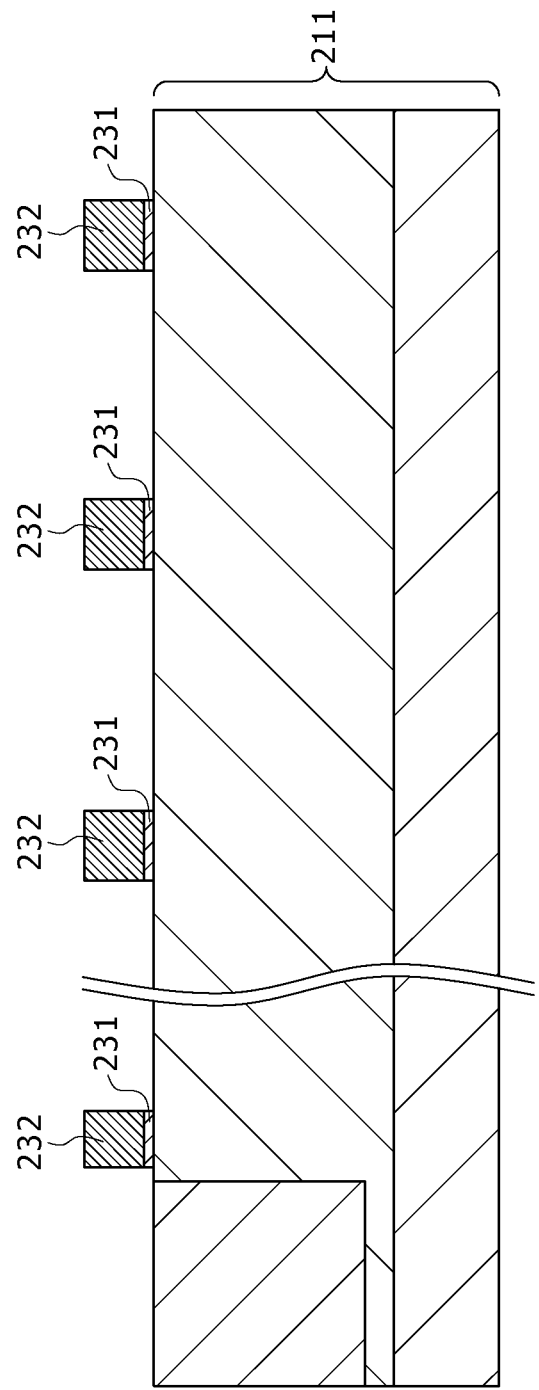

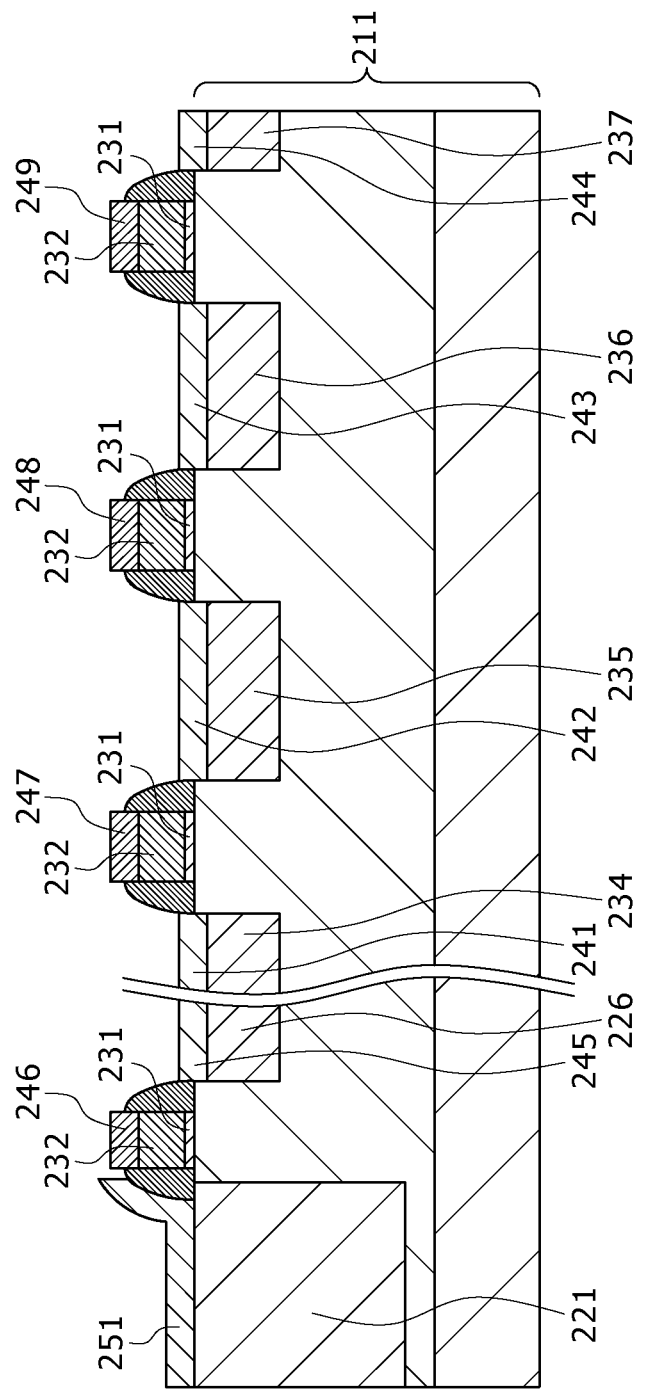

SOLID-STATE IMAGE PICKUP DEVICE AND METHOD OF MANUFACTURING SAME

RELATED APPLICATION DATA

This application is a division of U.S. patent application Ser. No. 12/372,857, filed Feb. 18, 2009, the entirety of which is incorporated herein by reference to the extent permitted by law. The present application claims the benefit of priority to Japanese Patent Application No. JP 2008-054560 filed in the Japan Patent Office on Mar. 5, 2008, the entirety of which is incorporated by reference herein to the extent permitted by law.

BACKGROUND OF THE INVENTION

The present invention relates to a solid-state image pickup device and a method of manufacturing the same.

With recent increase in degree of integration of semiconductor elements, solid-state image pickup devices have also been increased in the number of pixels and advanced in miniaturization.

On the other hand, characteristic degradation attendant thereon is becoming a great problem.

For example, an SN ratio is important for the improvement of image quality. Specifically, as the miniaturization progresses, a decrease of photons that can be taken in due to the miniaturization of a photodiode (PD) as a photoelectric conversion element inevitably reduces a signal quantity. It is thus necessary to improve the SN ratio by reducing noise.

In CMOS (Complementary Metal Oxide Semiconductor) image sensors, in particular, as shown in FIG. 14, a charge obtained by photoelectric conversion in a photodiode 221 is accumulated in a floating diffusion 226 via a transfer transistor 222 and thereafter subjected to signal amplification in an amplifying transistor 224 in many cases.

A noise proportional to a frequency generated in the amplifying transistor 224, or 1/f noise, is dominant as random noise of a pixel, and it is important to suppress the noise. In general, the following relation holds for the 1/f noise.

$$i_n^2 = KF((Id^{AF})/(C_{ox}WL_{eff}^{EF}))  \quad (1)$$

where $i_n^2$ is drain current noise density [$A^2$/Hz], KF (flicker noise coefficient) is a factor dependent on the element, Id is a drain current, $C_{ox}$ is a gate capacitance per unit area, and $L_{eff}$ is an effective gate length.

This is disclosed in IEEE Transaction on Electron Devices, Vol. 48, No. 5, May 2001, pp. 921 to 927.

According to the above Equation (1), a reduction of line width of the amplifying transistor 224, that is, miniaturization of the amplifying transistor 224 sharply increases the noise. KF is a factor dependent on the amplifying transistor 224, and is greatly affected by process factors.

One of the process factors is a stress applied to a channel part of the amplifying transistor 224. For higher speed and lower power consumption of a minute pixel, reducing gate wiring resistance and contact resistance by applying silicide to transistors within a pixel region is a very effective means, and the amplifying transistor 224 is no exception.

Generally, silicide techniques have been introduced to a generation of 0.25 µm or later in CMOS logic.

While a pixel region in a CMOS image sensor is highly likely to operate as a device as long as ohmic characteristics are maintained, techniques for reducing resistance such as salicide formation or the like become necessary with a reduction of a contact diameter.

However, a local tensile stress occurs in a channel part of a fine amplifying transistor where salicide is formed.

In addition, a correlation is found between stress and 1/f noise. The application of tensile stress increases the 1/f noise regardless of whether a carrier species is electrons or holes, or in both cases of an N-MOS and a P-MOS (see Authored by T. Ohguro, Y. Okayama, K. Matsuzawa, K. Matsunaga, N. Aoki, K. Kojima, H. S. Momose, and K. Ishimaru, "The impact of oxynitride process, deuterium annealing and STI stress to 1/f noise of 0.11 CMOS" 2003 Symposium on VLSI Technology Digest of Technical Papers, 2003, p. 37 and Authored by Shigenobu Maeda, You-Seung Jin, Jung-A Choi, Sun-Young Oh, Hyun-Woo Lee, Jae-Yoon Yoo, Min-Chul Sun, Ja-Hum Ku, Kwon Lee, Su-Gon Bae, Sung-Gun Kang, Jeong-Hwan Yang, Young-Wug Kim, and Kwang-Pyuk Suh, "Impact of Mechanical Stress Engineering on Flicker Noise Characteristics" 2004 Symposium on VLSI Technology Digest of Technical Papers, 2004, pp. 102 to 103, for example).

For the above-described reasons, when pixels are miniaturized and salicide is introduced into the pixels, it is difficult to tolerate noise degradation when a high SN ratio is to be achieved.

A process of manufacturing a CMOS image sensor in related art will next be described with reference to FIGS. 15A to 15E.

As shown in FIG. 15A, a P-type well region 212 is formed in an N-type silicon substrate 211.

Next, a photodiode 221 for performing photoelectric conversion is formed at a predetermined position on the surface side of the silicon substrate 211. The photodiode 221 is formed by a P-type region, an N-type region, and a P-type region from a bottom layer by performing ion implantation of phosphorus (P) as an N-type impurity and boron (B) as a P-type impurity using an ion implantation mask formed by patterning a resist film formed on the silicon substrate 211.

The energy of the ion implantation is adjusted such that the photodiode 221 is desirably formed between the surface of the semiconductor substrate 211 and a depth of 5 µm to 15 µm for visible light, and is for example formed between the surface of the semiconductor substrate 211 and a depth of about 5 µm.

As described above, an N-type substrate is used as the silicon substrate 211, and therefore isolation of the photodiode 221 is performed by the P-type well region 212.

Next, MOS type transistors within a pixel are formed.

As shown in FIG. 15B, a gate insulating film 231 is formed on the silicon substrate 211, and then a polysilicon film for forming gate electrodes is formed. Next, a resist mask (not shown) to serve as an etching mask for forming the gate electrodes is formed on the polysilicon film. With the resist mask used as etching mask, the polysilicon film is patterned, whereby the gate electrodes 232 of a transfer transistor, a reset transistor, an amplifying transistor, and a selecting transistor are formed by polysilicon.

Next, as shown in FIG. 15C, side walls 233 are formed on the side part of each of the gate electrodes 232 for a purpose of suppressing a short channel effect of a MOS transistor (not shown) of a peripheral circuit, the reset transistor, the amplifying transistor, the selecting transistor, and the like. The side walls 233 are formed by a silicon oxide film, for example. However, the side walls 233 can be formed by a silicon nitride film.

Next, a resist mask (not shown) is formed, and diffusion layers 234, 235, 236, and 237 serving as sources and drains of the transistors are formed in the semiconductor substrate 211 by ion implantation using the resist mask.

In general, when holes and electrons are compared with each other as carriers, holes are more easily trapped on the gate insulating film 231 and the interface. Thus, this time, electrons are selected as carriers, that is, N-MOS is formed. A floating diffusion 226 is also formed at the same time by the ion implantation.

Next, as shown in FIG. 15D, silicide layers 241 to 249 are formed on the diffusion layers 234 to 237, on the floating diffusion 226, and on the gate electrodes 232, respectively, by a salicide process.

Prior to the salicide process, because silicide layers have low optical transparency, a silicide blocking film 251 is formed on the photodiode 221 to prevent the formation of a silicide layer on the photodiode 221. The silicide blocking film 251 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 241 to 249.

Next, as shown in FIG. 15E, an etching stopper film 252 for temporarily stopping etching at a time of contact processing is formed on an entire surface over the silicon substrate 211. The etching stopper film 252 is formed by a silicon nitride film, a silicon oxynitride film or the like that makes it easy to secure a selective etching ratio with respect to a silicon oxide film as an interlayer insulating film to be formed later.

Thereafter, though not shown, an interlayer insulating film is formed, and a contact part is formed using tungsten.

Further, a wiring layer, an interlayer insulating film, a planarizing insulating film, a color filter layer, and a microchip lens, and the like are formed, whereby the CMOS image sensor is completed.

However, in the above-described CMOS image sensor, variations in 1/f noise increase significantly due not only to a finer design rule of the amplifying transistor (AMP) but also to the load of tensile stress on the channel part by the silicide layers 243 and 244 of the amplifying transistor 224. As a result, the SN ratio is lowered, and it is difficult to obtain sufficient image quality.

SUMMARY OF THE INVENTION

A problem to be solved is that when a silicide layer is introduced into a transistor within a pixel or the like to miniaturize the pixel, variations in 1/f noise increase significantly due to the load of tensile stress on the channel part of the transistor by the silicide layer, so that the SN ratio is lowered and thus sufficient image quality cannot be obtained.

The present invention makes it possible to prevent the lowering of the SN ratio by suppressing increase in variation in 1/f noise and thus obtain sufficient image quality even when a silicide layer is introduced into a transistor to miniaturize the pixel.

According to an embodiment of the present invention, there is provided a solid-state image pickup device including: a photoelectric conversion section configured to convert incident light into a signal charge; a transfer transistor configured to read the signal charge from the photoelectric conversion section and transfer the signal charge; and an amplifying transistor configured to amplify the signal charge read by the transfer transistor, wherein a compressive stress film for applying a compressive stress to a channel part of the amplifying transistor is formed on the amplifying transistor.

In the solid-state image pickup device according to the above-described embodiment of the present invention, the compressive stress film is formed on the amplifying transistor. Therefore, a local tensile stress applied to a channel region of the amplifying transistor is relieved by the compressive stress of the compressive stress film, so that an increase in variation in 1/f noise of the amplifying transistor can be suppressed.

According to an embodiment of the present invention, there is provided a method of manufacturing a solid-state image pickup device, the solid-state image pickup device including, in a semiconductor substrate, a photoelectric conversion section configured to convert incident light into a signal charge, a transfer transistor configured to read the signal charge from the photoelectric conversion section and transfer the signal charge, and an amplifying transistor configured to amplify the signal charge read by the transfer transistor. The method includes the steps of: forming, after forming the amplifying transistor in the semiconductor substrate, an insulating film on the semiconductor substrate, the insulating film having an opening part on the amplifying transistor; forming a compressive stress film covering the amplifying transistor and having a compressive stress on the insulating film; and leaving the compressive stress film only on the amplifying transistor and removing the compressive stress film on other regions.

In the method of manufacturing the solid-state image pickup device according to the above-described embodiment of the present invention, the compressive stress film is formed on the amplifying transistor. Therefore, a local tensile stress applied to a channel region of the amplifying transistor is relieved by the compressive stress of the compressive stress film, so that an increase in variation in 1/f noise of the amplifying transistor can be suppressed.

According to an embodiment of the present invention, there is provided a method of manufacturing a solid-state image pickup device, the solid-state image pickup device including, in a semiconductor substrate, a photoelectric conversion section configured to convert incident light into a signal charge, a transfer transistor configured to read the signal charge from the photoelectric conversion section and transfer the signal charge, and an amplifying transistor configured to amplify the signal charge read by the transfer transistor. The method includes the steps of: forming, after forming the amplifying transistor in the semiconductor substrate, a compressive stress film covering the amplifying transistor and having a compressive stress on the semiconductor substrate; and leaving the compressive stress film only on the amplifying transistor and removing the compressive stress film on regions other than on the amplifying transistor.

In the method of manufacturing the solid-state image pickup device according to the above-described embodiment of the present invention, the compressive stress film is formed on the amplifying transistor. Therefore, a local tensile stress applied to a channel region of the amplifying transistor is relieved by the compressive stress of the compressive stress film, so that an increase in variation in 1/f noise of the amplifying transistor can be suppressed.

A solid-state image pickup device according to an embodiment of the present invention can suppress an increase in variation in 1/f noise of the amplifying transistor. Thus, because the lowering of the SN ratio can be suppressed, there is an advantage of being able to obtain excellent image quality by achieving a high SN ratio.

A method of manufacturing a solid-state image pickup device according to an embodiment of the present invention can suppress an increase in variation in 1/f noise of the amplifying transistor. Thus, because the lowering of the SN ratio can be suppressed, there is an advantage of being able to obtain excellent image quality by achieving a high SN ratio.

BRIEF DESCRIPTION OF THE DRAWINGS

FIGS. 7A to 7I are manufacturing process sectional views of an embodiment (first embodiment) of a method of manufacturing a solid-state image pickup device according to the present invention;

FIGS. 8A and 8B are manufacturing process sectional views of an embodiment (second embodiment) of a method of manufacturing a solid-state image pickup device according to the present invention;

FIGS. 12A to 12E are manufacturing process sectional views of an embodiment (sixth embodiment) of a method of manufacturing a solid-state image pickup device according to the present invention;

FIG. 14 is a schematic configuration sectional view of an example of a solid-state image pickup device in related art; and FIG. 15A to 15E are manufacturing process sectional views of an example of a method of manufacturing the solid-state image pickup device in related art.

DETAILED DESCRIPTION OF THE PREFERRED EMBODIMENTS

Figure 1:
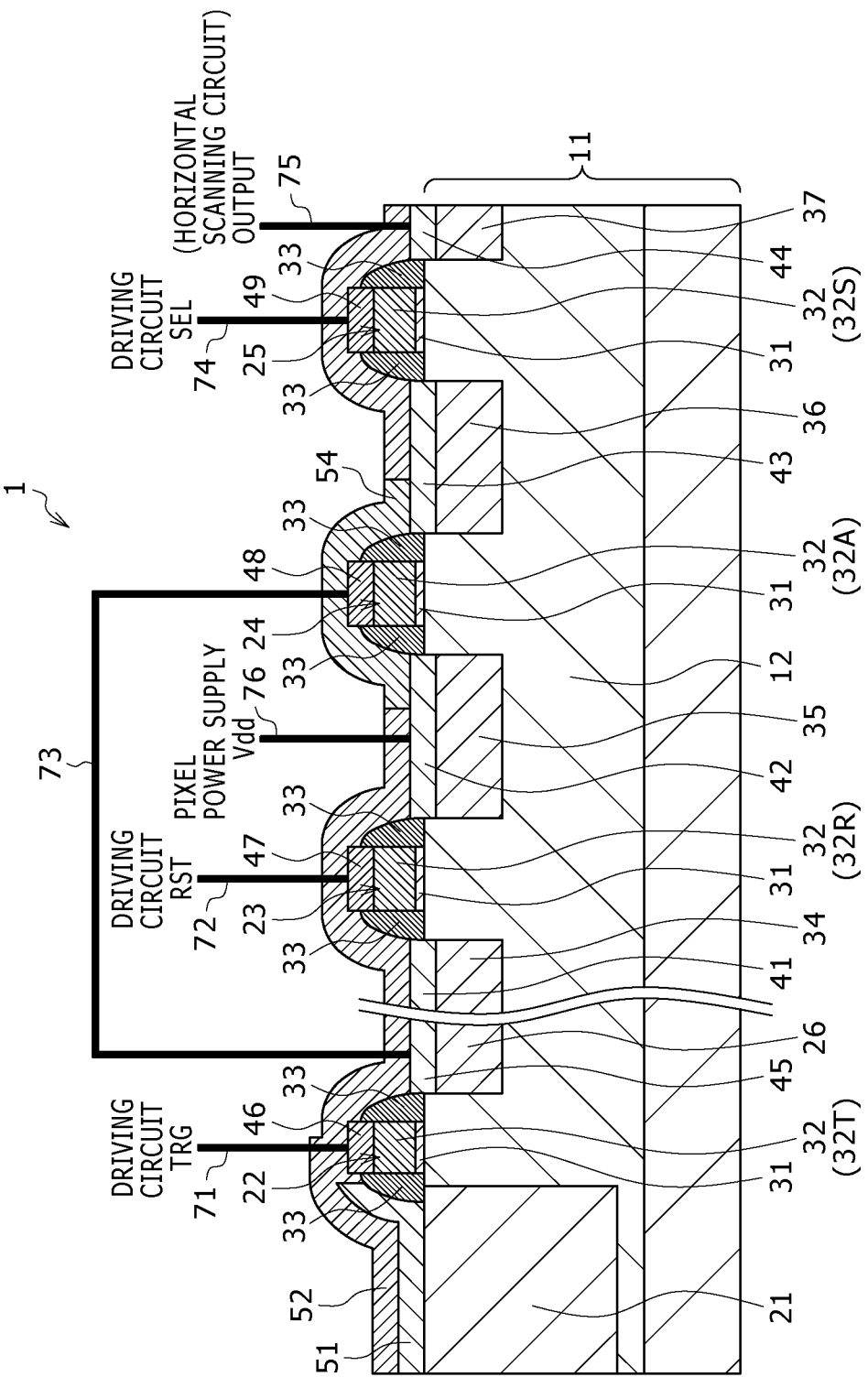
FIG. 1 is a schematic configuration sectional view of an embodiment (first embodiment) of a solid-state image pickup device according to the present invention.
Figure 2:
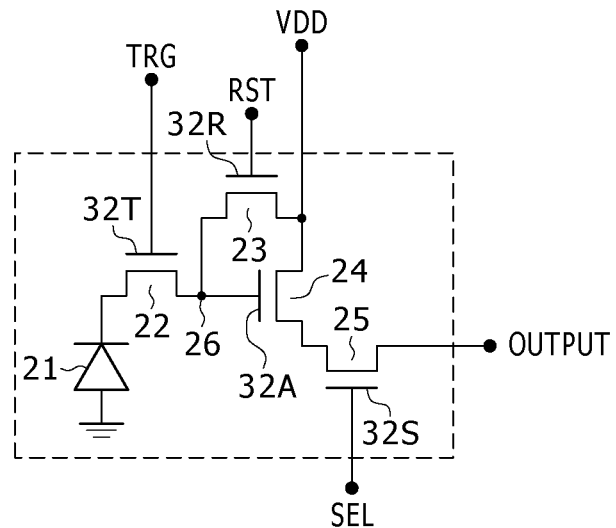
FIG. 2 is a circuit configuration diagram of an embodiment (first embodiment) of a solid-state image pickup device according to the present invention.

An embodiment (first embodiment) of a solid-state image pickup device according to the present invention will be described with reference to a schematic configuration sectional view of FIG. 1 and a circuit configuration diagram of FIG. 2. The solid-state image pickup device is a CMOS image sensor. FIG. 1 shows a sensor section of a pixel section of the CMOS image sensor and a group of transistors within the pixel. FIG. 2 shows an example of a circuit configuration of the CMOS image sensor.

Description will be made below with reference to FIG. 1 and FIG. 2.

A semiconductor substrate 11 of a first conduction type has a well region 12 of a second conduction type formed therein, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

A photoelectric conversion section (for example a photodiode (PD)) 21 for converting incident light into a signal charge is formed at a predetermined position on the surface side of the semiconductor substrate 11. The photoelectric conversion section 21 will hereinafter be described as photodiode 21.

The photodiode 21 is for example formed by a P-type region, an N-type region, and a P-type region from a bottom layer in the semiconductor substrate 11. The photodiode 21 is desirably formed between the surface of the semiconductor substrate 11 and a depth of 5 µm to 15 µm for visible light, and is for example formed between the surface of the semiconductor substrate 11 and a depth of about 5 µm.

As described above, an N-type silicon substrate is used as the semiconductor substrate 11, and therefore element isolation for the photodiode 21 is performed by the well region 12.

MOS type transistors within the pixel are formed on the semiconductor substrate 11.

Gate electrodes 32 are formed on the semiconductor substrate 11 with a gate insulating film 31 interposed between the gate electrodes 32 and the semiconductor substrate 11. These gate electrodes 32 are the gate electrode 32 (32R) of a reset transistor of the pixel transistor group, the gate electrode 32 (32A) of an amplifying transistor of the pixel transistor group, and the gate electrode 32 (32S) of a selecting transistor of the pixel transistor group. Each of the gate electrodes 32 is formed by polysilicon, for example.

In addition, the gate electrode 32 (32T) of a transfer transistor for reading the signal charge from the photodiode 21 and transferring the signal charge is formed adjoining the photodiode 21.

Incidentally, each gate electrode 32 has very fine dimensions of 0.1 µm×0.1 µm, for example.

Side walls 33 are formed on the side part of each of the gate electrodes 32. The side walls 33 are formed by a silicon oxide film, for example. Alternatively, the side walls 33 may be formed by a silicon nitride film.

Diffusion layers 34, 35, 36, and 37 serving as sources and drains of the transistors are formed in the semiconductor substrate 11 on both sides of the respective gate electrodes 32. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25. A floating diffusion (FD) 26 is also formed in the semiconductor substrate 11.

In general, when holes and electrons are compared with each other as carriers, holes are more easily trapped on the gate insulating film 31 and the interface. Thus, in this case, electrons are selected as carriers, that is, NMOS transistors are formed.

Silicide layers 41 to 44, 45, and 46 to 49 are formed on the diffusion layers 34 to 37, on the floating diffusion 26, and on the gate electrodes 32, respectively.

In addition, a silicide blocking film 51 is formed on the photodiode 21 to prevent the formation of a silicide layer as described above on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41 to 49.

The transfer transistor 22 is connected between the cathode electrode of the photodiode 21 and the floating diffusion 26 as a charge-voltage converting section. The transfer transistor 22 transfers the signal charge (electrons in this case) stored in the photodiode 21 as a result of photoelectric conversion by the photodiode 21 to the floating diffusion 26 when a transfer pulse TRG is supplied to the gate electrode (control electrode) 32TG.

The reset transistor 23 has a drain electrode (diffusion layer 35) connected to a reset line, and has a source electrode (diffusion layer 34) connected to the floating diffusion 26. When a reset pulse RST is supplied to the gate electrode 32R prior to the transfer of the signal charge from the photodiode 21 to the floating diffusion 26, the reset transistor 23 resets the potential of the floating diffusion 26 to a reset voltage Vrst.

The amplifying transistor 24 has the gate electrode 32A connected to the floating diffusion 26, and has a drain electrode (common diffusion layer 35) connected to a pixel power supply Vdd. The amplifying transistor 24 outputs the potential of the floating diffusion 26 after being reset by the reset transistor 23 as a reset level, and outputs the potential of the floating diffusion 26 after the transfer transistor 22 transfers the signal charge as a signal level.

The selecting transistor 25 for example has a drain electrode (diffusion layer 36) connected to the source electrode (common diffusion layer 36) of the amplifying transistor 24, and has a source electrode connected to an output signal line. When a selecting pulse SEL is supplied to the gate electrode 32S, the selecting transistor 25 is set in an on state, and outputs a signal output from the amplifying transistor 24 with the pixel in a selected state to the output signal line (wiring 75). Incidentally, the selecting transistor 25 can also be connected between the pixel power supply Vdd and the drain electrode of the amplifying transistor 24.

An etching stopper film 52 having an opening 53 formed on the amplifying transistor 24 is formed on an entire surface over the semiconductor substrate 11. The etching stopper film 52 is formed by a silicon nitride film, a silicon oxynitride film or the like that makes it easy to secure a selective etching ratio with respect to a silicon oxide film as an interlayer insulating film to be formed later.

On the other hand, a compressive stress film 54 having a compressive stress is formed on the amplifying transistor 24 so as to cover the amplifying transistor 24. This compressive stress film 54 is formed by a silicon oxide film, for example.

The etching stopper film 52 and the compressive stress film 54 are desirably of different film species because different film species make it easy to secure a processing (etching) selectivity. For example, as described above, the etching stopper film 52 is formed by a silicon nitride film, and the compressive stress film 54 is formed by a silicon oxide film. Of course, it may be vice versa, or two species of a silicon nitride film, a silicon oxide film, and a silicon oxynitride film can be selected and used.

When the etching stopper film 52 and the compressive stress film 54 are of a same species, a structure having an intermediate film of a different species inserted between the etching stopper film 52 and the compressive stress film 54 is desirable.

Though not shown, for example, when a silicon nitride film is applied as the etching stopper film 52, a silicon oxide film is applied as the intermediate film.

Further formed are for example wiring 71 for connecting the transfer transistor electrode 32T and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 37 of the selecting transistor 25 and a horizontal scanning circuit (output) (not shown) to each other, wiring 76 for connecting the diffusion layer 35 shared between the reset transistor 23 and the amplifying transistor 24 and the pixel power supply Vdd (not shown) to each other, and the like.

In the solid-state image pickup device 1 according to the present embodiment, the compressive stress film 54 having a compressive stress is formed on the amplifying transistor 24. Therefore, a local tensile stress applied to a channel region of the amplifying transistor 24 which stress is caused by the silicide layers 42 and 43 formed on the diffusion layers 35 and 36 of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

Figure 3:
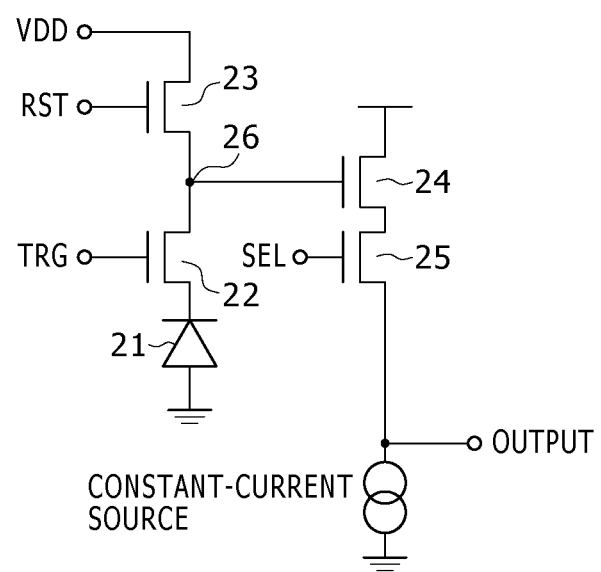
FIG. 3 is a circuit configuration diagram showing another circuit configuration in the first embodiment of the solid-state image pickup device.

The circuit configuration of a pixel transistor section shown by FIG. 2 may be formed as shown in FIG. 3.

As shown in FIG. 3, a photodiode 21 is provided, and a transfer transistor 22 is provided so as to be connected to the photodiode 21. The transfer transistor 22 is connected between the cathode electrode of the photodiode 21 and a floating diffusion 26 as a charge-voltage converting section. The transfer transistor 22 transfers a signal charge (electrons in this case) stored in the photodiode 21 as a result of photoelectric conversion by the photodiode 21 to the floating diffusion 26 when a transfer pulse TRG is supplied to the gate electrode (control electrode) 32TG.

A reset transistor 23 has a drain electrode (diffusion layer 35) connected to a pixel power supply Vdd, and has a source electrode (diffusion layer 34) connected to the floating diffusion 26. When a reset pulse RST is supplied to the gate electrode 32R prior to the transfer of the signal charge from the photodiode 21 to the floating diffusion 26, the reset transistor 23 resets the potential of the floating diffusion 26 to a reset voltage Vrst.

An amplifying transistor 24 has a gate electrode 32A connected to the floating diffusion 26. The amplifying transistor 24 outputs the potential of the floating diffusion 26 after being reset by the reset transistor 23 as a reset level, and outputs the potential of the floating diffusion 26 after the transfer transistor 22 transfers the signal charge as a signal level.

A selecting transistor 25 for example has a drain electrode (diffusion layer 36) connected to the source electrode (common diffusion layer 36) of the amplifying transistor 24, and has a source electrode connected to an output signal line. When a selecting pulse SEL is supplied to the gate electrode 32S, the selecting transistor 25 is set in an on state, and outputs a signal output from the amplifying transistor 24 with the pixel in a selected state to the output signal line (wiring 75).

An example in which a compressive stress film is formed without an etching stopper film being formed will next be described as an embodiment (second embodiment) of a solid-state image pickup device according to the present invention with reference to a schematic configuration sectional view of FIG. 4.

In the foregoing first embodiment, the etching stopper film is formed to prevent excessive etching into the diffusion layers when a contact is formed. When the etching stopper film is not required, a compressive stress film is formed without the etching stopper film being formed.

A solid-state image pickup device in this case (second embodiment) will be described in the following.

Figure 4:
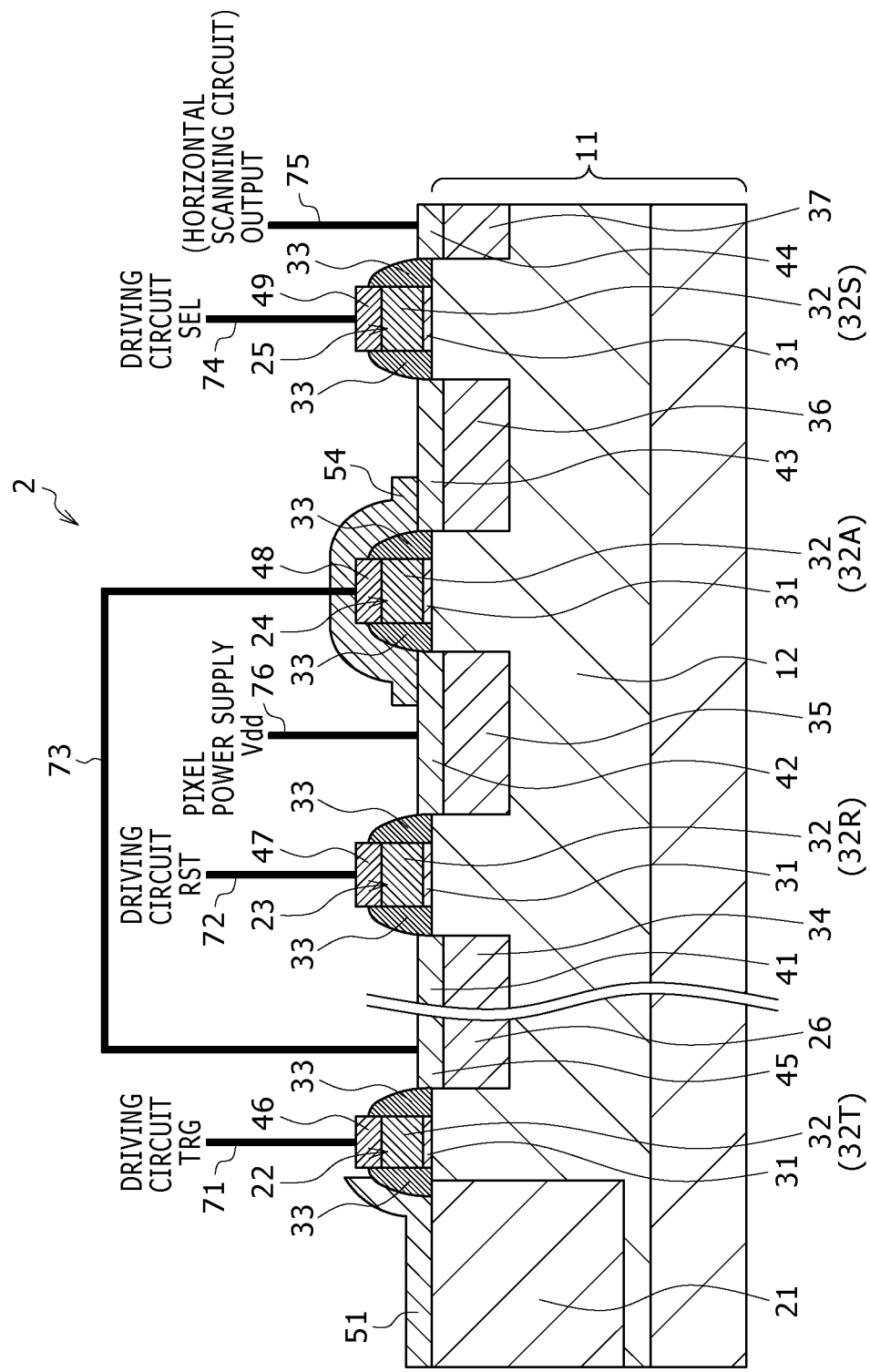
FIG. 4 is a schematic configuration sectional view of an embodiment (second embodiment) of a solid-state image pickup device according to the present invention.

As shown in FIG. 4, a semiconductor substrate 11 of a first conduction type has a well region 12 of a second conduction type formed therein, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

A photoelectric conversion section (for example a photodiode (PD)) 21 for converting incident light into a signal charge is formed at a predetermined position on the surface side of the semiconductor substrate 11.

The photodiode 21 is for example formed by a P-type region, an N-type region, and a P-type region from a bottom layer in the semiconductor substrate 11. The photodiode 21 is desirably formed between the surface of the semiconductor substrate 11 and a depth of 5 μm to 15 μm for visible light, and is for example formed between the surface of the semiconductor substrate 11 and a depth of about 5 μm.

As described above, an N-type silicon substrate is used as the semiconductor substrate 11, and therefore element isolation for the photodiode 21 is performed by the well region 12.

MOS type transistors within the pixel are formed on the semiconductor substrate 11.

Gate electrodes 32 are formed on the semiconductor substrate 11 with a gate insulating film 31 interposed between the gate electrodes 32 and the semiconductor substrate 11. These gate electrodes 32 are the gate electrode 32 (32R) of a reset transistor of the pixel transistor group, the gate electrode 32 (32A) of an amplifying transistor of the pixel transistor group, and the gate electrode 32 (32S) of a selecting transistor of the pixel transistor group. Each of the gate electrodes 32 is formed by polysilicon, for example.

In addition, the gate electrode 32 (32T) of a transfer transistor for reading the signal charge from the photodiode 21 and transferring the signal charge is formed adjoining the photodiode 21.

Incidentally, each gate electrode 32 has very fine dimensions of 0.1 μm×0.1 μm, for example.

Side walls 33 are formed on the side part of each of the gate electrodes 32. The side walls 33 are formed by a silicon oxide film, for example. Alternatively, the side walls 33 may be formed by a silicon nitride film.

Diffusion layers 34, 35, 36, and 37 serving as sources and drains of the transistors are formed in the semiconductor substrate 11 on both sides of the respective gate electrodes 32. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25. A floating diffusion (FD) 26 is also formed in the semiconductor substrate 11.

In general, when holes and electrons are compared with each other as carriers, holes are more easily trapped on the gate insulating film 31 and the interface. Thus, in this case, electrons are selected as carriers, that is, NMOS transistors are formed.

Silicide layers 41 to 44, 45, and 46 to 49 are formed on the diffusion layers 34 to 37, on the floating diffusion 26, and on the gate electrodes 32, respectively.

In addition, a silicide blocking film 51 is formed on the photodiode 21 to prevent the formation of a silicide layer as described above on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41 to 49.

The transfer transistor 22 is connected between the cathode electrode of the photodiode 21 and the floating diffusion 26 as a charge-voltage converting section. The transfer transistor 22 transfers the signal charge (electrons in this case) stored in the photodiode 21 as a result of photoelectric conversion by the photodiode 21 to the floating diffusion 26 when a transfer pulse TRG is supplied to the gate electrode (control electrode) 32T.

The reset transistor 23 has a drain electrode (diffusion layer 35) connected to a reset line, and has a source electrode (diffusion layer 34) connected to the floating diffusion 26. When a reset pulse RST is supplied to the gate electrode 32R prior to the transfer of the signal charge from the photodiode 21 to the floating diffusion 26, the reset transistor 23 resets the potential of the floating diffusion 26 to a reset voltage Vrst.

The amplifying transistor 24 has the gate electrode 32A connected to the floating diffusion 26, and has a drain electrode (common diffusion layer 35) connected to a pixel power supply Vdd. The amplifying transistor 24 outputs the potential of the floating diffusion 26 after being reset by the reset transistor 23 as a reset level, and outputs the potential of the floating diffusion 26 after the transfer transistor 22 transfers the signal charge as a signal level.

The selecting transistor 25 for example has a drain electrode (diffusion layer 36) connected to the source electrode (common diffusion layer 36) of the amplifying transistor 24, and has a source electrode connected to an output signal line. When a selecting pulse SEL is supplied to the gate electrode 32S, the selecting transistor 25 is set in an on state, and outputs a signal output from the amplifying transistor 24 with the pixel in a selected state to the output signal line (wiring 75). Incidentally, the selecting transistor 25 can also be connected between the pixel power supply Vdd and the drain electrode of the amplifying transistor 24.

A compressive stress film 54 having a compressive stress is formed on the amplifying transistor 24 so as to cover the amplifying transistor 24. This compressive stress film 54 is formed by a silicon nitride film or a silicon oxide film, for example.

Further formed are for example wiring 71 for connecting the gate electrode 32T of the transfer transistor 22 and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 37 of the selecting transistor 25 and a horizontal scanning circuit (output) (not shown) to each other, wiring 76 for connecting the diffusion layer 35 shared between the reset transistor 23 and the amplifying transistor 24 and the pixel power supply Vdd (not shown) to each other, and the like.

In the solid-state image pickup device 2 according to the present embodiment, the compressive stress film 54 having a compressive stress is formed on the amplifying transistor 24. Therefore, a local tensile stress applied to a channel region of the amplifying transistor 24 which stress is caused by the silicide layers 42 and 43 formed on the diffusion layers 35 and 36 of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

In addition, because the etching stopper film as in the first embodiment is not formed, there is an advantage of being able to reduce each of the numbers of film formation steps, lithography steps, and etching steps, for example, by one as compared with the solid-state image pickup device 1 according to the first embodiment.

An example having an element isolation region of a shallow trench element isolation structure made by forming an insulator within a groove, the element isolation region being adjacent to a diffusion layer of an amplifying transistor, will next be described as an embodiment (third embodiment) of a solid-state image pickup device 3 according to the present invention with reference to a schematic configuration sectional view of FIG. 5.

Figure 5:
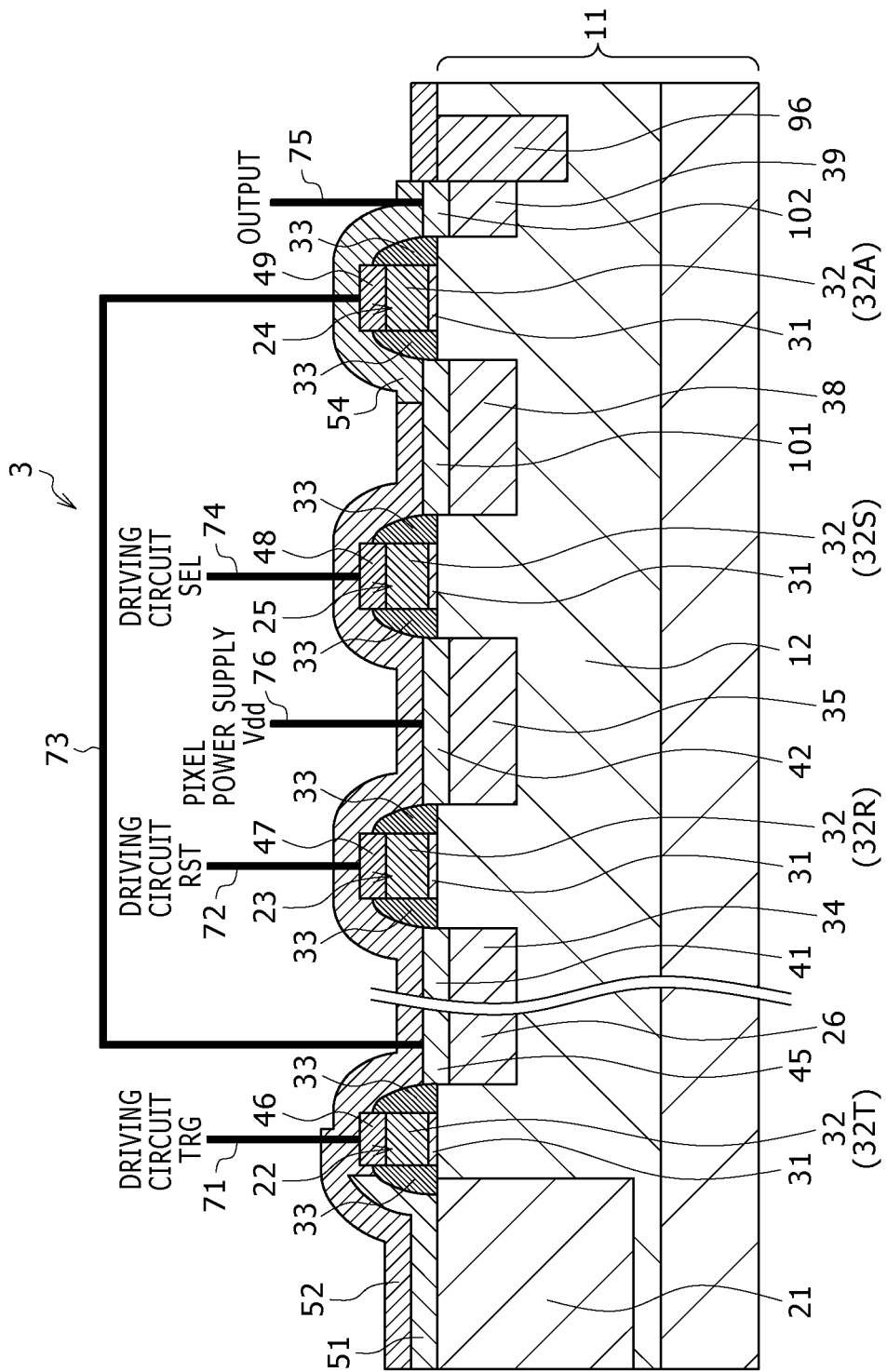
FIG. 5 is a schematic configuration sectional view of an embodiment (third embodiment) of a solid-state image pickup device according to the present invention.

As shown in FIG. 5, a semiconductor substrate 11 of a first conduction type has a well region 12 of a second conduction type formed therein, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

An element isolation region 96 of an STI (Shallow Trench Isolation) structure is formed which separates regions for forming pixel transistors such as a region for forming a reset transistor, a region for forming an amplifying transistor, a region for forming a selecting transistor, and the like formed in the semiconductor substrate 11.

A photoelectric conversion section (for example a photodiode (PD)) 21 for converting incident light into a signal charge is formed at a predetermined position on the surface side of the semiconductor substrate 11.

The photodiode 21 is for example formed by a P-type region, an N-type region, and a P-type region from a bottom layer in the semiconductor substrate 11. The photodiode 21 is desirably formed between the surface of the semiconductor substrate 11 and a depth of 5 μm to 15 μm for visible light, and is for example formed between the surface of the semiconductor substrate 11 and a depth of about 5 μm.

As described above, an N-type silicon substrate is used as the semiconductor substrate 11, and therefore element isolation for the photodiode 21 is performed by the well region 12.

MOS type transistors within the pixel are formed on the semiconductor substrate 11.

Gate electrodes 32 are formed on the semiconductor substrate 11 with a gate insulating film 31 interposed between the gate electrodes 32 and the semiconductor substrate 11. These gate electrodes 32 are the gate electrode 32 (32R) of the reset transistor of the pixel transistor group, the gate electrode 32 (32S) of the selecting transistor of the pixel transistor group, and the gate electrode 32 (32A) of the amplifying transistor of the pixel transistor group. Each of the gate electrodes 32 is formed by polysilicon, for example.

In addition, the gate electrode 32 (32T) of a transfer transistor for reading the signal charge from the photodiode 21 and transferring the signal charge is formed adjoining the photodiode 21.

Incidentally, each gate electrode 32 has very fine dimensions of 0.1 μm×0.1 μm, for example.

Side walls 33 are formed on the side part of each of the gate electrodes 32. The side walls 33 are formed by a silicon oxide film, for example. Alternatively, the side walls 33 may be formed by a silicon nitride film.

Diffusion layers 34, 35, 38, and 39 serving as sources and drains of the transistors are formed in the semiconductor substrate 11 on both sides of the respective gate electrodes 32. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25. A floating diffusion (FD) 26 is also formed in the semiconductor substrate 11.

In general, when holes and electrons are compared with each other as carriers, holes are more easily trapped on the gate insulating film 31 and the interface. Thus, in this case, electrons are selected as carriers, that is, NMOS transistors are formed.

Silicide layers 41, 42, 101, and 102, 45, and 46 to 49 are formed so as to correspond to the diffusion layers 34, 35, 38, and 39, the floating diffusion 26, and the gate electrodes 32, respectively.

In addition, a silicide blocking film 51 is formed on the photodiode 21 to prevent the formation of a silicide layer as described above on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41, 42, 101, and 102 and 45 to 49.

The transfer transistor 22 is connected between the cathode electrode of the photodiode 21 and the floating diffusion 26 as a charge-voltage converting section. The transfer transistor 22 transfers the signal charge (electrons in this case) stored in the photodiode 21 as a result of photoelectric conversion by the photodiode 21 to the floating diffusion 26 when a transfer pulse TRG is supplied to the gate electrode (control electrode) 32T.

The reset transistor 23 has a drain electrode (diffusion layer 35) connected to a reset line, and has a source electrode (diffusion layer 34) connected to the floating diffusion 26. When a reset pulse RST is supplied to the gate electrode 32R prior to the transfer of the signal charge from the photodiode 21 to the floating diffusion 26, the reset transistor 23 resets the potential of the floating diffusion 26 to a reset voltage Vrst.

The amplifying transistor 24 has the gate electrode 32A connected to the floating diffusion 26. The amplifying transistor 24 outputs the potential of the floating diffusion 26 after being reset by the reset transistor 23 as a reset level, and outputs the potential of the floating diffusion 26 after the transfer transistor 22 transfers the signal charge as a signal level.

The selecting transistor 25 for example has a drain electrode (diffusion layer 38) connected to the source electrode (common diffusion layer 38) of the amplifying transistor 24, and has a source electrode connected to an output signal line. When a selecting pulse SEL is supplied to the gate electrode 32S, the selecting transistor 25 is set in an on state, and outputs a signal output from the amplifying transistor 24 with the pixel in a selected state to the output signal line (wiring 75).

An etching stopper film 52 having an opening 53 formed on the amplifying transistor 24 is formed on an entire surface over the semiconductor substrate 11. The etching stopper film 52 is formed by a silicon nitride film, a silicon oxynitride film or the like that makes it easy to secure a selective etching ratio with respect to a silicon oxide film as an interlayer insulating film to be formed later.

On the other hand, a compressive stress film 54 having a compressive stress is formed on the amplifying transistor 24 so as to cover the amplifying transistor 24. This compressive stress film 54 is formed by a silicon oxide film, for example.

The etching stopper film 52 and the compressive stress film 54 are desirably of different film species because different film species make it easy to secure a processing (etching) selectivity. For example, as described above, the etching stopper film 52 is formed by a silicon nitride film, and the compressive stress film 54 is formed by a silicon oxide film. Of course, it may be vice versa, or two species of a silicon nitride film, a silicon oxide film, and a silicon oxynitride film can be selected and used.

When the etching stopper film 52 and the compressive stress film 54 are of a same species, a structure having an intermediate film of a different species inserted between the etching stopper film 52 and the compressive stress film 54 is desirable.

Though not shown, for example, when a silicon nitride film is applied as the etching stopper film 52, a silicon oxide film is applied as the intermediate film.

Further formed are for example wiring 71 for connecting the gate electrode 32T of the transfer transistor 22 and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 39 of the amplifying transistor 24 and a horizontal scanning circuit (output) (not shown) to each other, wiring 76 for connecting the diffusion layer 35 shared between the reset transistor 23 and the selecting transistor 25 and the pixel power supply Vdd (not shown) to each other, and the like.

In the solid-state image pickup device 3 according to the present embodiment, the compressive stress film 54 having a compressive stress is formed on the amplifying transistor 24. Therefore, a local tensile stress applied to a channel region of the amplifying transistor 24 which stress is caused by the silicide layers 101 and 102 formed on the diffusion layers 38 and 39 of the amplifying transistor 24 and the element isolation region 96 is relieved by the compressive stress of the compressive stress film 54, so that an increase in variation in 1/f noise of the amplifying transistor 24 can be suppressed.

Hence, because lowering of an SN ratio can be suppressed, there is an advantage of being able to obtain excellent image quality by achieving a high SN ratio.

Thus, noise is reduced, whereby an STI element isolation region can be formed for isolation between elements. It is therefore possible to form a narrower space between elements, and achieve a higher degree of integration.

An embodiment (fourth embodiment) of a solid-state image pickup device 4 according to the present invention will next be described with reference to a schematic configuration sectional view of FIG. 6.

Figure 6:
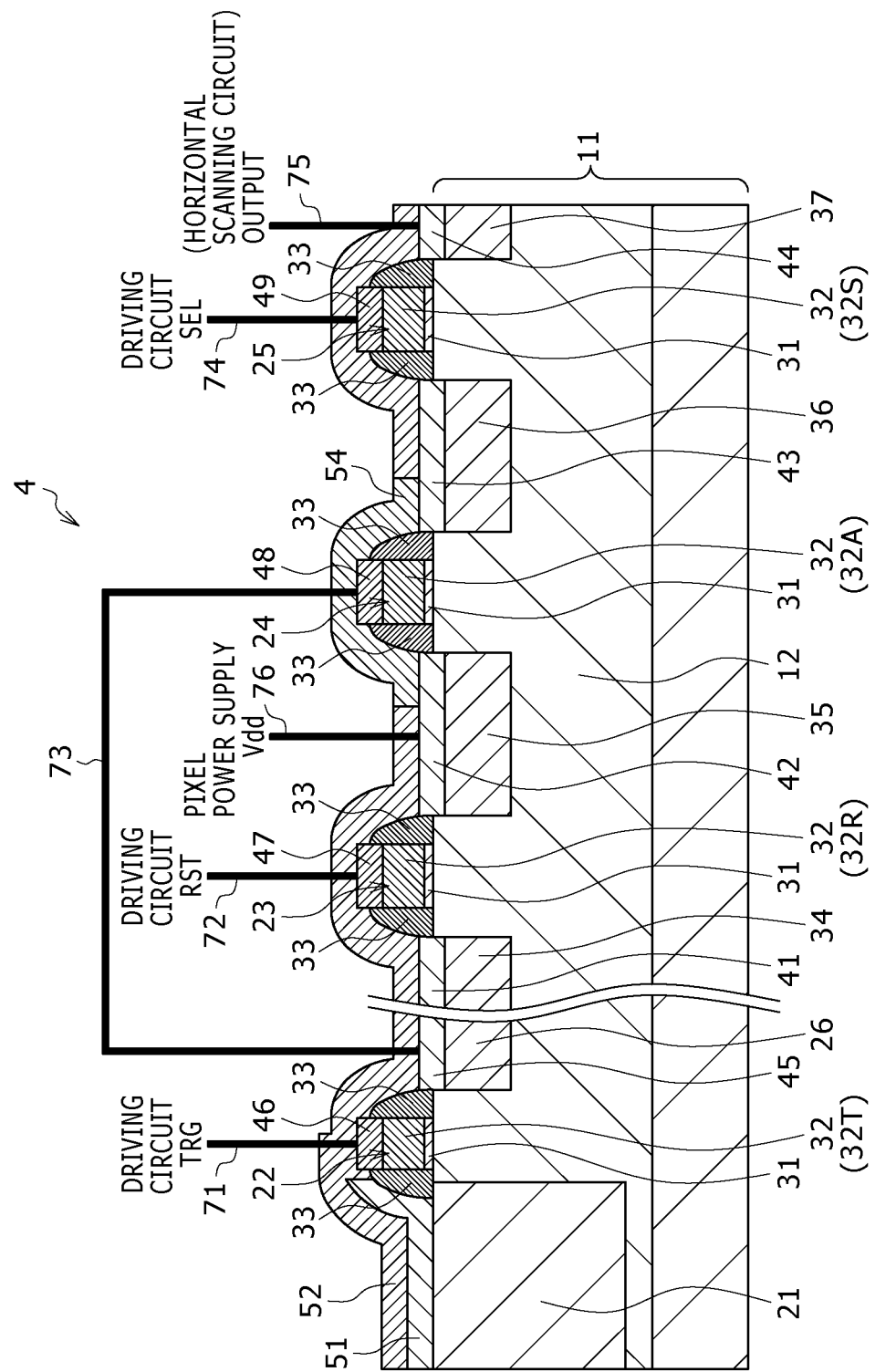
FIG. 6 is a schematic configuration sectional view of an embodiment (fourth embodiment) of a solid-state image pickup device according to the present invention.

As shown in FIG. 6, a semiconductor substrate 11 of a first conduction type has a well region 12 of a second conduction type formed therein, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

A photoelectric conversion section (for example a photodiode (PD)) 21 for converting incident light into a signal charge is formed at a predetermined position on the surface side of the semiconductor substrate 11. The photoelectric conversion section 21 will hereinafter be described as photodiode 21.

The photodiode 21 is for example formed by a P-type region, an N-type region, and a P-type region from a bottom layer in the semiconductor substrate 11. The photodiode 21 is desirably formed between the surface of the semiconductor substrate 11 and a depth of 5 μm to 15 μm for visible light, and is for example formed between the surface of the semiconductor substrate 11 and a depth of about 5 μm.

As described above, an N-type silicon substrate is used as the semiconductor substrate 11, and therefore element isolation for the photodiode 21 is performed by the well region 12.

MOS type transistors within the pixel are formed on the semiconductor substrate 11.

Gate electrodes 32 are formed on the semiconductor substrate 11 with a gate insulating film 31 interposed between the gate electrodes 32 and the semiconductor substrate 11. These gate electrodes 32 are the gate electrode 32 (32R) of a reset transistor of the pixel transistor group, the gate electrode 32 (32A) of an amplifying transistor of the pixel transistor group, and the gate electrode 32 (32S) of a selecting transistor of the pixel transistor group. Each of the gate electrodes 32 is formed by polysilicon, for example.

In addition, the gate electrode 32 (32T) of a transfer transistor for reading the signal charge from the photodiode 21 and transferring the signal charge is formed adjoining the photodiode 21.

Side walls 33 are formed on the side part of each of the gate electrodes 32. The side walls 33 are formed by a silicon nitride film, for example.

In particular, the side walls 33 (33A) formed on the side walls of the gate electrode 32A of the amplifying transistor 24 are formed by a compressive stress film having a compressive stress. Such a compressive stress film is for example formed by subjecting only the silicon nitride film formed on the side walls of the gate electrode 32 of the amplifying transistor 24 to electron beam irradiation or to nitrogen ion implantation and heat treatment (for example RTA (Rapid Thermal Annealing)). Of course, the compressive stress film may be formed by other manufacturing methods.

Diffusion layers 34, 35, 36, and 37 serving as sources and drains of the transistors are formed in the semiconductor substrate 11 on both sides of the respective gate electrodes 32. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25. A floating diffusion (FD) 26 is also formed in the semiconductor substrate 11.

In general, when holes and electrons are compared with each other as carriers, holes are more easily trapped on the gate insulating film 31 and the interface. Thus, in this case, electrons are selected as carriers, that is, NMOS transistors are formed.

Silicide layers 41 to 44, 45, and 46 to 49 are formed on the diffusion layers 34 to 37, on the floating diffusion 26, and on the gate electrodes 32, respectively.

In addition, a silicide blocking film 51 is formed on the photodiode 21 to prevent the formation of a silicide layer as described above on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41 to 49.

The transfer transistor 22 is connected between the cathode electrode of the photodiode 21 and the floating diffusion 26 as a charge-voltage converting section. The transfer transistor 22 transfers the signal charge (electrons in this case) stored in the photodiode 21 as a result of photoelectric conversion by the photodiode 21 to the floating diffusion 26 when a transfer pulse TRG is supplied to the gate electrode (control electrode) 32T.

The reset transistor 23 has a drain electrode (diffusion layer 35) connected to a reset line, and has a source electrode (diffusion layer 34) connected to the floating diffusion 26. When a reset pulse RST is supplied to the gate electrode 32R prior to the transfer of the signal charge from the photodiode 21 to the floating diffusion 26, the reset transistor 23 resets the potential of the floating diffusion 26 to a reset voltage Vrst.

The amplifying transistor 24 has the gate electrode 32A connected to the floating diffusion 26, and has a drain electrode (common diffusion layer 35) connected to a pixel power supply Vdd. The amplifying transistor 24 outputs the potential of the floating diffusion 26 after being reset by the reset transistor 23 as a reset level, and outputs the potential of the floating diffusion 26 after the transfer transistor 22 transfers the signal charge as a signal level.

The selecting transistor 25 for example has a drain electrode (diffusion layer 36) connected to the source electrode (common diffusion layer 36) of the amplifying transistor 24, and has a source electrode connected to an output signal line. When a selecting pulse SEL is supplied to the gate electrode 32S, the selecting transistor 25 is set in an on state, and outputs a signal output from the amplifying transistor 24 with the pixel in a selected state to the output signal line (wiring 75). Incidentally, the selecting transistor 25 can also be connected between the pixel power supply Vdd and the drain electrode of the amplifying transistor 24.

An etching stopper film 52 having an opening 53 formed on the amplifying transistor 24 is formed on an entire surface over the semiconductor substrate 11. The etching stopper film 52 is formed by a silicon nitride film, a silicon oxynitride film or the like that makes it easy to secure a selective etching ratio with respect to a silicon oxide film as an interlayer insulating film to be formed later.

On the other hand, a compressive stress film 54 having a compressive stress is formed on the amplifying transistor 24 so as to cover the amplifying transistor 24. This compressive stress film 54 is formed by a silicon oxide film, for example.

The etching stopper film 52 and the compressive stress film 54 are desirably of different film species because different film species make it easy to secure a processing (etching) selectivity. For example, as described above, the etching stopper film 52 is formed by a silicon nitride film, and the compressive stress film 54 is formed by a silicon oxide film. Of course, it may be vice versa, or two species of a silicon nitride film, a silicon oxide film, and a silicon oxynitride film can be selected and used.

When the etching stopper film 52 and the compressive stress film 54 are of a same species, a structure having an intermediate film of a different species inserted between the etching stopper film 52 and the compressive stress film 54 is desirable.

Though not shown, for example, when a silicon nitride film is applied as the etching stopper film 52, a silicon oxide film is applied as the intermediate film.

Further formed are for example wiring 71 for connecting the gate electrode 32T of the transfer transistor and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 37 of the selecting transistor 25 and a horizontal scanning circuit (output) (not shown) to each other, wiring 76 for connecting the diffusion layer 35 shared between the reset transistor 23 and the amplifying transistor 24 and the pixel power supply Vdd (not shown) to each other, and the like.

In the solid-state image pickup device 4 according to the present embodiment, the compressive stress film 54 having a compressive stress is formed on the amplifying transistor 24. Therefore, a local tensile stress applied to a channel region of the amplifying transistor 24 which stress is caused by the silicide layers 42 and 43 formed on the diffusion layers 35 and 36 of the amplifying transistor 24 is relieved by the compressive stress of the compressive stress film 54 and the compressive stress of the side walls 33A formed by a compressive stress film, so that an increase in variation in 1/f noise of the amplifying transistor 24 can be suppressed more than in the first to third embodiments.

Thus, because lowering of an SN ratio can be suppressed, there is an advantage of being able to obtain excellent image quality by achieving a high SN ratio.

The fourth embodiment is applicable to the second and third embodiments.

An embodiment (first embodiment) of a method of manufacturing a solid-state image pickup device according to the present invention will next be described with reference to manufacturing process sectional views of FIGS. 7A to 7I.

As shown in FIG. 7A, in a semiconductor substrate 11 of a first conduction type, a well region 12 of a second conduction type is formed, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

Next, a photodiode (PD) 21 for performing photoelectric conversion is formed at a predetermined position on the surface side of the semiconductor substrate 11. The photodiode 21 is for example formed by a P-type region, an N-type region, and a P-type region from a bottom layer by performing ion implantation of phosphorus (P) as an N-type impurity and boron (B) as a P-type impurity using an ion implantation mask formed by patterning a resist film formed on the semiconductor substrate 11. The energy of the ion implantation is adjusted such that the photodiode 21 is desirably formed between the surface of the semiconductor substrate 11 and a depth of 5 μm to 15 μm for visible light, and is for example formed between the surface of the semiconductor substrate 11 and a depth of about 5 μm.

As described above, an N-type silicon substrate is used as the semiconductor substrate 11, and therefore element isolation for the photodiode 21 is performed by the well region 12.

Thereafter, the ion implantation mask formed by the resist film is removed.

Next, MOS type transistors within a pixel are formed.

As shown in FIG. 7B, a gate insulating film 31 is formed on the semiconductor substrate 11, and then an electrode forming film for forming gate electrodes is formed. The electrode forming film is formed by polysilicon, for example.

Next, a resist mask (not shown) to serve as an etching mask for forming the gate electrodes is formed on the electrode forming film. The electrode forming film is patterned using the resist mask as etching mask, whereby the gate electrodes 32 made of the electrode forming film are formed. These gate electrodes 32 are the gate electrode 32 (32R) of a reset transistor of a pixel transistor group, the gate electrode 32 (32A) of an amplifying transistor of the pixel transistor group, and the gate electrode 32 (32S) of a selecting transistor of the pixel transistor group.

In addition, the gate electrode 32 (32T) of a transfer transistor is formed at the same time.

Incidentally, each gate electrode 32 has very fine dimensions of 0.1 μm×0.1 μm, for example.

Thereafter the resist mask used as the etching mask is removed.

Figure 7C:
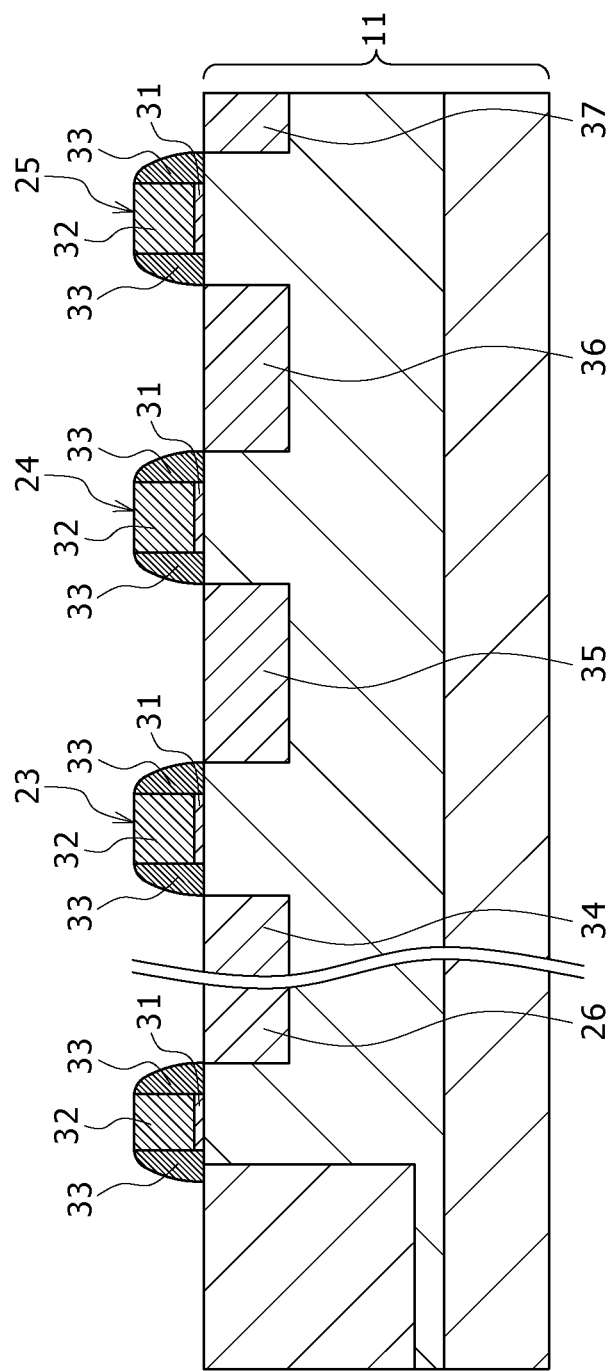

Next, as shown in FIG. 7C, side walls 33 are formed on the side part of each of the gate electrodes 32 for a purpose of suppressing a short channel effect of a peripheral circuit, the pixel transistors and the like. The side walls 33 are formed by a silicon oxide film, for example. Alternatively, the side walls 33 can be formed by a silicon nitride film.

Next, a resist mask (not shown) is formed by ordinary resist coating and lithography techniques, and diffusion layers 34, 35, 36, and 37 serving as sources and drains of the transistors are formed by ion implantation using the resist mask. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25.

In general, when holes and electrons are compared with each other as carriers, holes are more easily trapped on the gate insulating film 31 and the interface. Thus, in this case, electrons are selected as carriers, that is, NMOS transistors are formed. A floating diffusion (FD) 26 is also formed in the semiconductor substrate 11 at the same time by the ion implantation.

Thereafter, the resist mask used as mask for the ion implantation is removed.

Figure 7D:
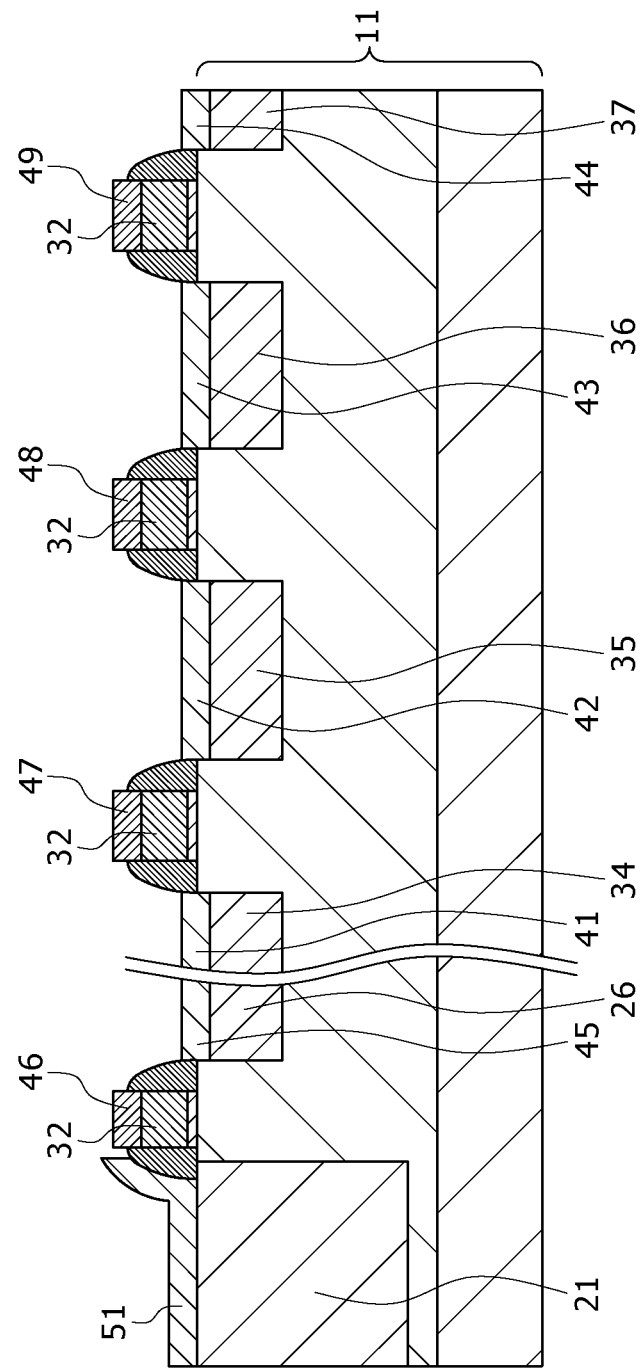

Next, as shown in FIG. 7D, silicide layers 41 to 44, 45, and 46 to 49 are formed on the diffusion layers 34 to 37, on the floating diffusion 26, and on the gate electrodes 32, respectively, by a salicide process.

Prior to the salicide process, because silicide layers have low optical transparency, a silicide blocking film 51 is formed on the photodiode 21 to prevent the formation of a silicide layer on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41 to 49.

Next, as shown in FIG. 7E, an etching stopper film 52 for temporarily stopping etching at a time of contact processing is formed on an entire surface over the semiconductor substrate 11. The etching stopper film 52 is formed by a silicon nitride film, a silicon oxynitride film or the like that makes it easy to secure a selective etching ratio with respect to a silicon oxide film as an interlayer insulating film to be formed later.

Next, a resist film 61 is formed on the etching stopper film 52 by ordinary resist coating techniques. A resist for KrF, for example, is used as the resist film 61. Next, the resist film 61 over the amplifying transistor 24 is removed to form an opening 62 by ordinary lithography techniques.

Next, the etching stopper film 52 on the amplifying transistor 24 is removed with the resist film 61 used as an etching mask.

As a result, as shown in FIG. 7F, an opening 53 is formed in the etching stopper film 52 on the amplifying transistor 24. This etching is performed by reactive ion etching (RIE) using for example a fluorocarbon (CF) base gas as an etching gas.

Thereafter the resist film 61 (see FIG. 7E) is removed.

Next, a compressive stress film 54 having a compressive stress is formed on the etching stopper film 52 so as to cover the top of the amplifying transistor 24. This compressive stress film 54 is formed by a silicon oxide film, for example.

Figure 7G:
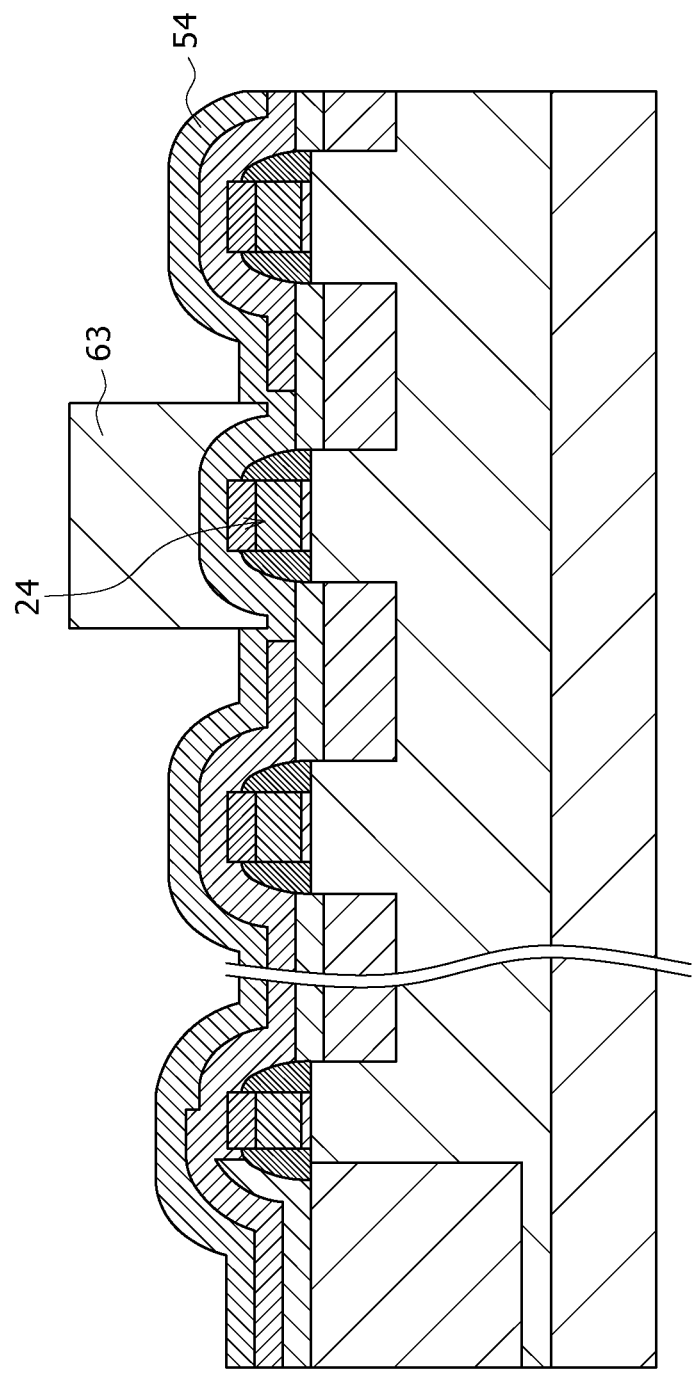

Next, as shown in FIG. 7G, a resist film 63 is formed on the compressive stress film 54 by ordinary resist coating techniques. A resist for KrF, for example, is used as the resist film 63. Next, by ordinary lithography techniques, the resist film 63 is left over only the amplifying transistor 24, and the resist film 63 over other parts is removed.

When a positive type resist is used as the resist film 61 described earlier, using a negative type resist as the resist film 63 makes it possible to expose both the resists to light by one mask, and thus reduce the number of masks. When conversely a negative type resist is used as the resist film 61 described earlier, using a positive type resist as the resist film 63 similarly makes it possible to reduce the number of masks.

Next, as shown in FIG. 7H, with the resist film 63 (see FIG. 7G) as an etching mask, the compressive stress film 54 is left on the amplifying transistor 24, and the compressive stress film 54 over other parts is removed. This etching is performed by reactive ion etching (RIE) using for example a fluorocarbon (CF) base gas as an etching gas.

Thereafter the resist film 63 is removed. The drawing shows a state after the resist film 63 is removed.

The etching stopper film 52 and the compressive stress film 54 are desirably of different film species because different film species make it easy to secure a processing (etching) selectivity. For example, as described above, the etching stopper film 52 is formed by a silicon nitride film, and the compressive stress film 54 is formed by a silicon oxide film. Of course, it may be vice versa, or two species of a silicon nitride film, a silicon oxide film, and a silicon oxynitride film can be selected and used.

The compressive stress film 54 can be formed under the following conditions.

As an example, when a parallel plate plasma CVD (Chemical Vapor Deposition) system is used to form a silicon oxide film, TEOS (Tetra Ethyl Ortho Silicate) and oxygen ($O_2$) are used as material gas, and helium (He) is used as carrier gas. Suppose that as an example, flow rates of the respective gases are TEOS:$O_2$:He=2000 cm$^3$/min:20000 cm$^3$/min:2000 cm$^3$/min. In addition, conditions where plasma generation power is 1500 W, the pressure of a film formation atmosphere is 1.07 kPa, and the temperature of the substrate is 400° C. were applied. The silicon oxide film formed under such conditions had a compressive stress of 0.5 GPa.

As another example, when a parallel plate plasma CVD system is used to form a silicon nitride film, monosilane ($SiH_4$) and nitrogen ($N_2$) are used as material gas. Suppose that as an example, flow rates of the respective gases are $SiH_4:N_2=100$ cm$^3$/min:4000 cm$^3$/min. In addition, conditions where plasma generation power is 500 W, the pressure of a film formation atmosphere is 400 Pa, and the temperature of the substrate is 400° C. were applied. The silicon nitride film formed under such conditions had a compressive stress of 1 GPa.

In addition, by changing these conditions as appropriate, the compressive stress film of a silicon oxide film or a silicon nitride film having a desired compressive stress value can be formed.

Alternatively, when the etching stopper film 52 and the compressive stress film 54 are of a same species, a structure having an intermediate film of a different species inserted between the etching stopper film 52 and the compressive stress film 54 is desirable.

Though not shown, for example, when a silicon nitride film is applied as the etching stopper film 52, a silicon oxide film is laminated as the intermediate film, and thereafter an opening 53 is formed in the etching stopper film 52 and the intermediate film over the amplifying transistor 24 by lithography and reactive ion etching (RIE).

Thereafter the compressive stress film 54 is formed. Next the resist film 63 covering only the top of the amplifying transistor 24 is formed. With the resist film 63 used as an etching mask, etching leaves the compressive stress film 54 on the amplifying transistor 24 and removes the compressive stress film 54 over other parts. In this etching, a selective etching ratio of the silicon oxide film to the intermediate film can be secured, and thus stable etching treatment can be performed.

In addition, even when the films are of a same species, etching can be performed by specifying time to control damage to the foundation film and an amount of digging.

Next, a wiring process is performed. For example, wiring 71 for connecting the gate electrode 32T of the transfer transistor 22 and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 37 of the selecting transistor 25 and a horizontal scanning circuit (output) (not shown) to each other, wiring 76 for connecting the diffusion layer 35 shared between the reset transistor 23 and the amplifying transistor 24 and the pixel power supply Vdd (not shown) to each other, and the like are formed.

The formation of each of the pieces of wiring 71 to 76 and the like described above is similar to ordinary wiring formation.

Figure 7I:
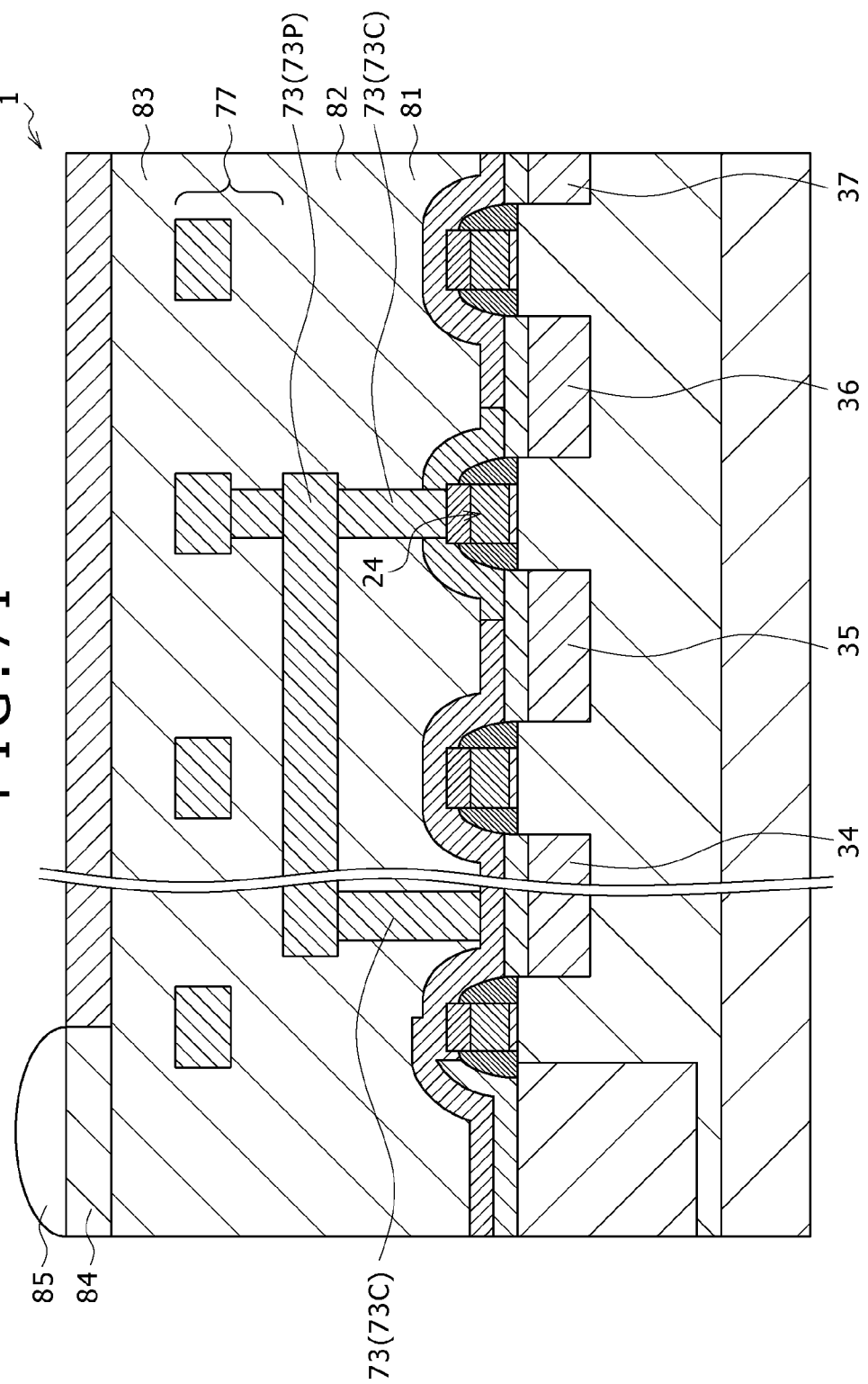

For example, as shown in FIG. 7I, an interlayer insulating film 81 and contact parts 73C for connecting the floating diffusion 26 and the gate electrode 32A of the amplifying transistor 24 to each other, for example, are formed. The contact parts 73C are formed by an ordinary tungsten plug. For example contact parts (not shown) connected to the other gate electrodes 32, the diffusion layers 34 to 37, and the like can also be formed at the same time.

Further, the wiring 73 is formed by making connection wiring 73P for connecting the contact parts 73C to each other, and other wiring (not shown) is also formed at the same time. Further, a plurality of layers of an interlayer insulating film 82, upper layer wiring 77, a planarizing insulating film 83, a color filter layer 84, a microchip lens 85, and the like are formed, whereby the solid-state image pickup device (CMOS image sensor) 1 is completed.

In the method of manufacturing the solid-state image pickup device 1 according to the present embodiment, the compressive stress film 54 having a compressive stress is formed on the amplifying transistor 24. Therefore, a local tensile stress applied to a channel region of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

An embodiment (second embodiment) of a method of manufacturing a solid-state image pickup device according to the present invention will next be described with reference to manufacturing process sectional views of FIGS. 8A and 8B.

In the foregoing first embodiment, the etching stopper film is formed to prevent excessive etching into the diffusion layers when a contact is formed. When the etching stopper film is not required, however, a compressive stress film may be formed without the etching stopper film being formed.

A manufacturing method in this case (second embodiment) will be described in the following.

Figure 8A:
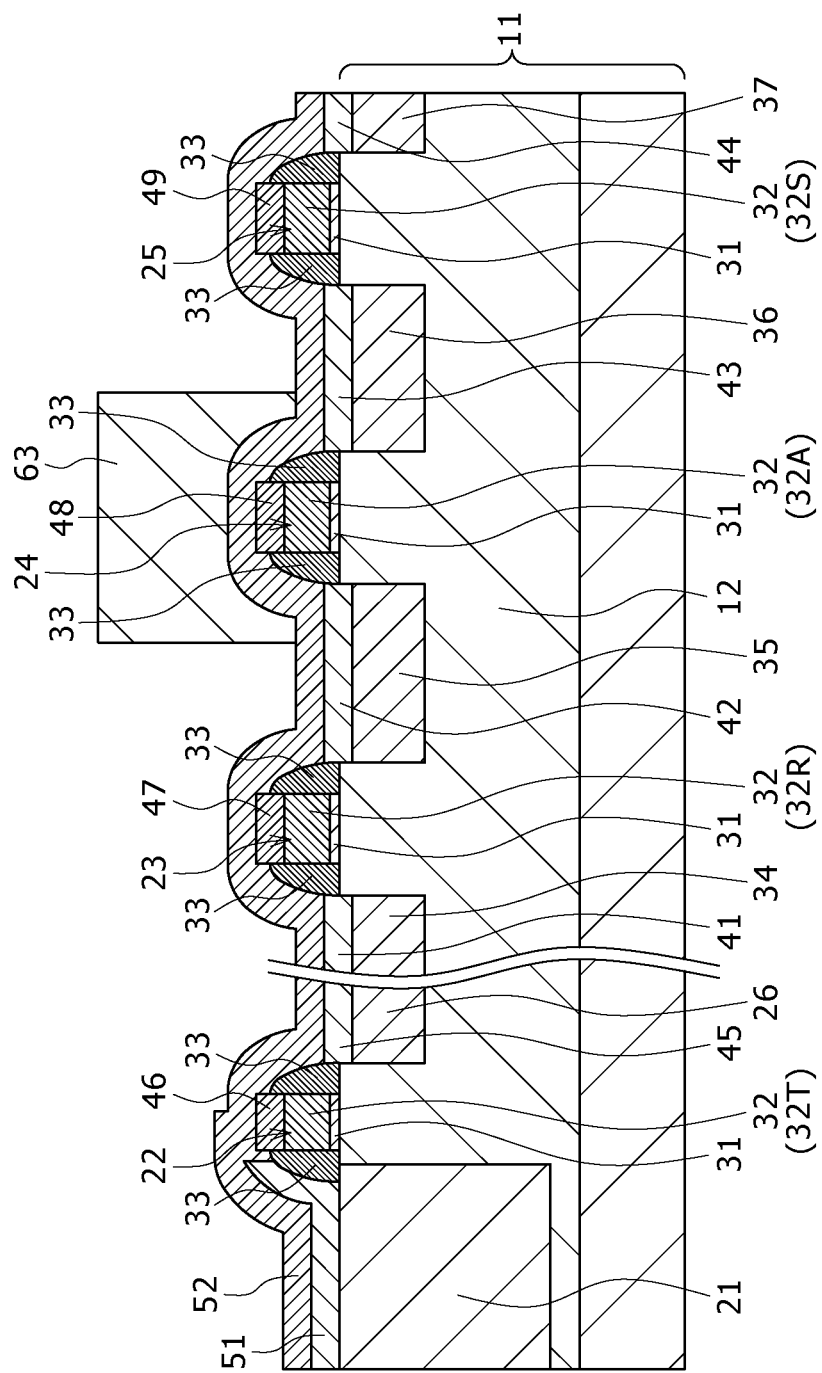

As shown in FIG. 8A, as described with reference to FIGS. 7A to 7D, in a semiconductor substrate 11 of a first conduction type, a well region 12 of a second conduction type is formed, the second conduction type being an opposite conduction type from the first conduction type. Description in the following will be made supposing that, as an example, the first conduction type is an N-type and the second conduction type is a P-type. For example an N-type silicon substrate is used as the above-described semiconductor substrate 11.

Next, a photodiode (PD) 21 for performing photoelectric conversion is formed at a predetermined position on the surface side of the semiconductor substrate 11. The photodiode 21 is for example formed by a P-type region, an N-type region, and a P-type region from a bottom layer by performing ion implantation of phosphorus (P) as an N-type impurity and boron (B) as a P-type impurity using an ion implantation mask formed by patterning a resist film formed on the semiconductor substrate 11. The energy of the ion implantation is adjusted such that the photodiode 21 is desirably formed between the surface of the semiconductor substrate 11 and a depth of 5 μm to 15 μm for visible light, and is for example formed between the surface of the semiconductor substrate 11 and a depth of about 5 μm.

As described above, an N-type silicon substrate is used as the semiconductor substrate 11, and therefore element isolation for the photodiode 21 is performed by the well region 12.

Next, MOS type transistors within a pixel are formed.

A gate insulating film 31 is formed on the semiconductor substrate 11, and then gate electrodes 32 are formed. These gate electrodes 32 are the gate electrode 32 (32R) of a reset transistor of a pixel transistor group, the gate electrode 32 (32A) of an amplifying transistor of the pixel transistor group, and the gate electrode 32 (32S) of a selecting transistor of the pixel transistor group.

In addition, the gate electrode 32 (32T) of a transfer transistor 22 is formed at the same time.

Next, side walls 33 are formed on the side part of each of the gate electrodes 32 for a purpose of suppressing a short channel effect of a peripheral circuit, the pixel transistors and the like. The side walls 33 are formed by a silicon oxide film, for example. Alternatively, the side walls 33 can be formed by a silicon nitride film.

Next, a resist mask (not shown) is formed by ordinary resist coating and lithography techniques, and diffusion layers 34, 35, 36, and 37 serving as sources and drains of the transistors are formed by ion implantation using the resist mask. In this case, as an example, the diffusion layer 35 is shared as one diffusion layer 35 of the reset transistor 23 and one diffusion layer 35 of the amplifying transistor 24, and the diffusion layer 36 is shared as another diffusion layer 36 of the amplifying transistor 24 and one diffusion layer 36 of the selecting transistor 25.

In general, when holes and electrons are compared with each other as carriers, holes are more easily trapped on the gate insulating film 31 and the interface. Thus, in this case, electrons are selected as carriers, that is, NMOS transistors are formed. A floating diffusion (FD) 26 is also formed in the semiconductor substrate 11 at the same time by the ion implantation.

Thereafter, the resist mask used as mask for the ion implantation is removed.

Next, silicide layers 41 to 44, 45, and 46 to 49 are formed on the diffusion layers 34 to 37, on the floating diffusion 26, and on the gate electrodes 32, respectively, by a salicide process.

Prior to the salicide process, because silicide layers have low optical transparency, a silicide blocking film 51 is formed on the photodiode 21 to prevent the formation of a silicide layer on the photodiode 21. The silicide blocking film 51 is desirably formed by a silicon oxide film, a silicon nitride film, a silicon oxynitride film or the like. A titanium silicide, a tantalum silicide, a molybdenum silicide, a nickel silicide, a tungsten silicide, a nickel-platinum silicide or the like can be applied as the silicide layers 41 to 49.

Next, a compressive stress film 54 having a compressive stress is formed on an entire surface over the semiconductor substrate 11 so as to cover the top of the amplifying transistor 24. This compressive stress film 54 is formed by a silicon nitride film or a silicon oxide film, for example.

Next, a resist film 63 is formed on the compressive stress film 54 by ordinary resist coating techniques. A resist for KrF, for example, is used as the resist film 63. Next, by ordinary lithography techniques, the resist film 63 is left over only the amplifying transistor 24, and the resist film 63 over other parts is removed.

Next, as shown in FIG. 8B, with the resist film 63 (see FIG. 8A) as an etching mask, the compressive stress film 54 is left on the amplifying transistor 24, and the compressive stress film 54 over other parts is removed. This etching is performed by reactive ion etching (RIE) using for example a fluorocarbon (CF) base gas as an etching gas.

Thereafter the resist film 63 is removed. The drawing shows a state after the resist film 63 is removed.

The compressive stress film 54 can be formed under the following conditions.

As an example, when a parallel plate plasma CVD system is used to form a silicon oxide film, TEOS (Tetra Ethyl Ortho Silicate) and oxygen ($O_2$) are used as material gas, and helium (He) is used as carrier gas. Suppose that as an example, flow rates of the respective gases are TEOS:$O_2$:He=2000 cm$^3$/min:20000 cm$^3$/min:2000 cm$^3$/min. In addition, conditions where plasma generation power is 1500 W, the pressure of a film formation atmosphere is 1.07 kPa, and the temperature of the substrate is 400° C. were applied. The silicon oxide film formed under such conditions had a compressive stress of 0.5 GPa.

As another example, when a parallel plate plasma CVD system is used to form a silicon nitride film, monosilane ($SiH_4$) and nitrogen ($N_2$) are used as material gas. Suppose that as an example, flow rates of the respective gases are $SiH_4$:$N_2$=100 cm$^3$/min:4000 cm$^3$/min. In addition, conditions where plasma generation power is 500 W, the pressure of a film formation atmosphere is 400 Pa, and the temperature of the substrate is 400° C. were applied. The silicon nitride film formed under such conditions had a compressive stress of 1 GPa.

In addition, by changing these conditions as appropriate, the compressive stress film of a silicon oxide film or a silicon nitride film having a desired compressive stress value can be formed.

Next, as described above with reference to FIG. 7H, a wiring process is performed. For example, wiring 71 for connecting the gate electrode 32T of the transfer transistor 22 and a driving circuit (not shown) to each other, wiring 72 for connecting the gate electrode 32R of the reset transistor 23 and the driving circuit (not shown) to each other, wiring 73 for connecting the gate electrode 32A of the amplifying transistor 24 and the floating diffusion 26 to each other, wiring 74 for connecting the gate electrode 32S of the selecting transistor 25 and the driving circuit (not shown) to each other, wiring 75 for connecting the diffusion layer 37 of the selecting transistor 25 and a horizontal scanning circuit (output) (not shown) to each other, wiring 76 for connecting the diffusion layer 35 shared between the reset transistor 23 and the amplifying transistor 24 and the pixel power supply Vdd (not shown) to each other, and the like are formed.

The formation of each of the pieces of wiring 71 to 76 and the like described above is similar to ordinary wiring formation.

Thus, the solid-state image pickup device (CMOS image sensor) 2 is completed.

In the method of manufacturing the solid-state image pickup device 2 according to the present embodiment, the compressive stress film 54 having a compressive stress is formed on the amplifying transistor 24. Therefore, a local tensile stress applied to a channel region of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

There is another advantage of being able to reduce each of the numbers of film formation steps, lithography steps, and etching steps, for example, by one as compared with the manufacturing method according to the first embodiment.

Another manufacturing method (third embodiment) in which the compressive stress film 54 having a compressive stress is formed on the amplifying transistor 24 will next be described with reference to a manufacturing process sectional view of FIG. 9.

Figure 9:
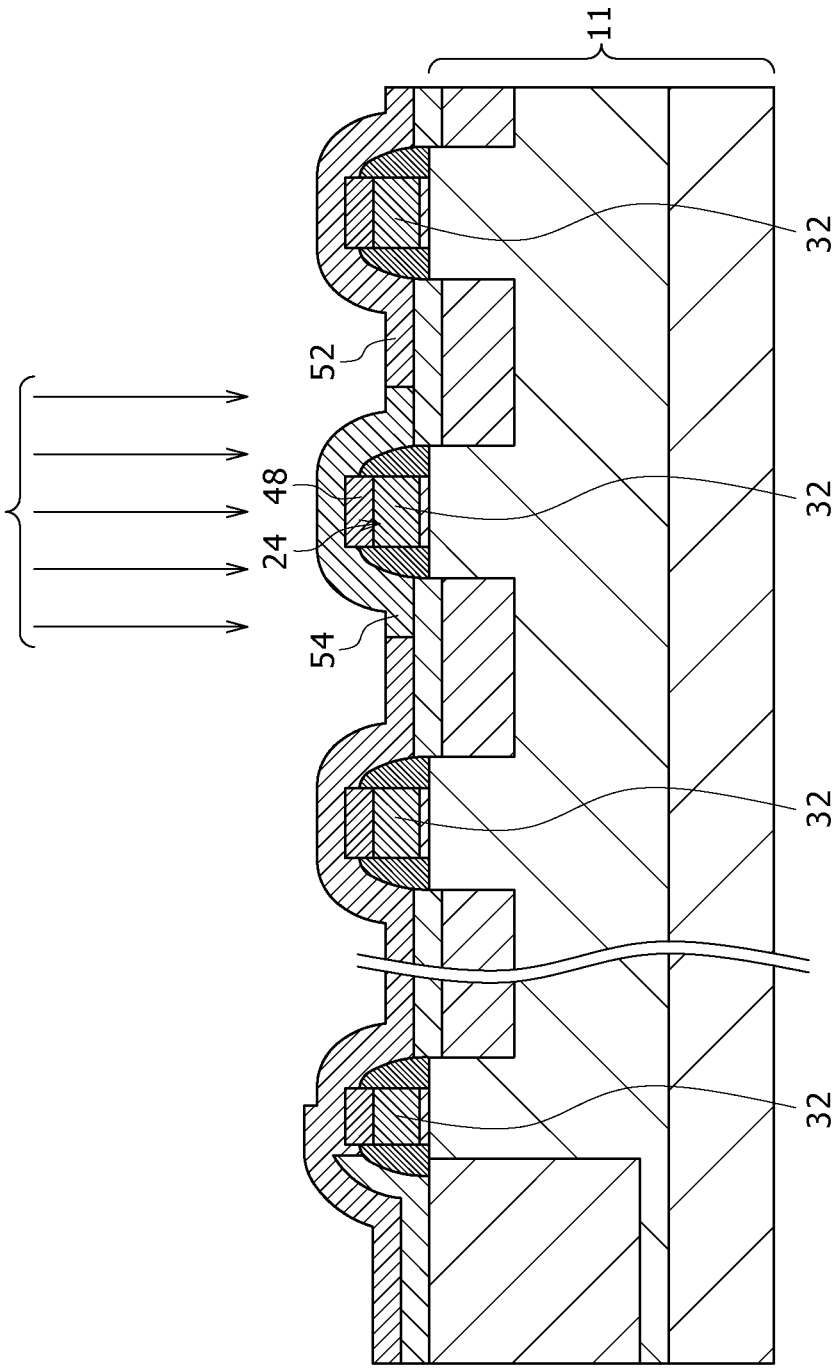
FIG. 9 is a manufacturing process sectional view of an embodiment (third embodiment) of a method of manufacturing a solid-state image pickup device according to the present invention.

As shown in FIG. 9, as described above with reference to FIGS. 7A to 7E, an etching stopper film 52 to cover gate electrodes 32 and the like is formed by a silicon nitride film, for example, on a semiconductor substrate 11.

Thereafter, only the etching stopper film 52 on an amplifying transistor 24 is locally subjected to electron beam cure. This process increases film density of the region of the etching stopper film 52 which region is irradiated with an electron beam, so that only the etching stopper film 52 on the amplifying transistor 24 can be made to be a compressive stress film 54 having a compressive stress.

For example, irradiation was performed for five minutes with a pressure of 0.93 kPa in an atmosphere of the electron beam irradiation and with a current of 1 mA and an acceleration voltage of 10 keV as conditions for the electron beam irradiation. The conditions are an example, and the electron beam irradiation conditions can be changed as appropriate depending on film density, film thickness and the like at the time of formation of the etching stopper film 52.

When a silicon nitride film is irradiated with an electron beam as described above, silicon-hydrogen bonds (Si—H bonds) in the silicon nitride film are broken, and there occur excess silicon bonds. At this time, excess bonds of nitrogen in the film are bonded to the silicon bonds to form stronger silicon-nitrogen bonds (Si—N bonds) than the silicon-hydrogen bonds. Thereby the silicon nitride film is densified. In general, densifying the silicon nitride film increases compressive stress in the film.

Thereafter, as described above with reference to FIG. 7H and FIG. 7I, processes for the formation of an interlayer insulating film, the formation of wiring and the like, the formation of a planarizing film, the formation of a color filter, the formation of a condensing lens, and the like are performed.

In the case of the manufacturing method according to the third embodiment, as in the manufacturing method according to the first embodiment, the compressive stress film 54 having a compressive stress is formed on the amplifying transistor 24. Therefore, a local tensile stress applied to a channel region of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

Further, the compressive stress film 54 can also be made to function as an etching stopper film. Therefore the compressive stress film 54 can function as an etching stopper for preventing excessive etching of the silicide layer 48 as a foundation when a connecting hole for connecting a contact part as a part of wiring connected to the floating diffusion 26, for example, is formed in a part above the gate electrode 32A of the amplifying transistor 24.

Another manufacturing method (fourth embodiment) in which the compressive stress film 54 having a compressive stress is formed on the amplifying transistor 24 will next be described with reference to a manufacturing process sectional view of FIG. 10.

Figure 10:
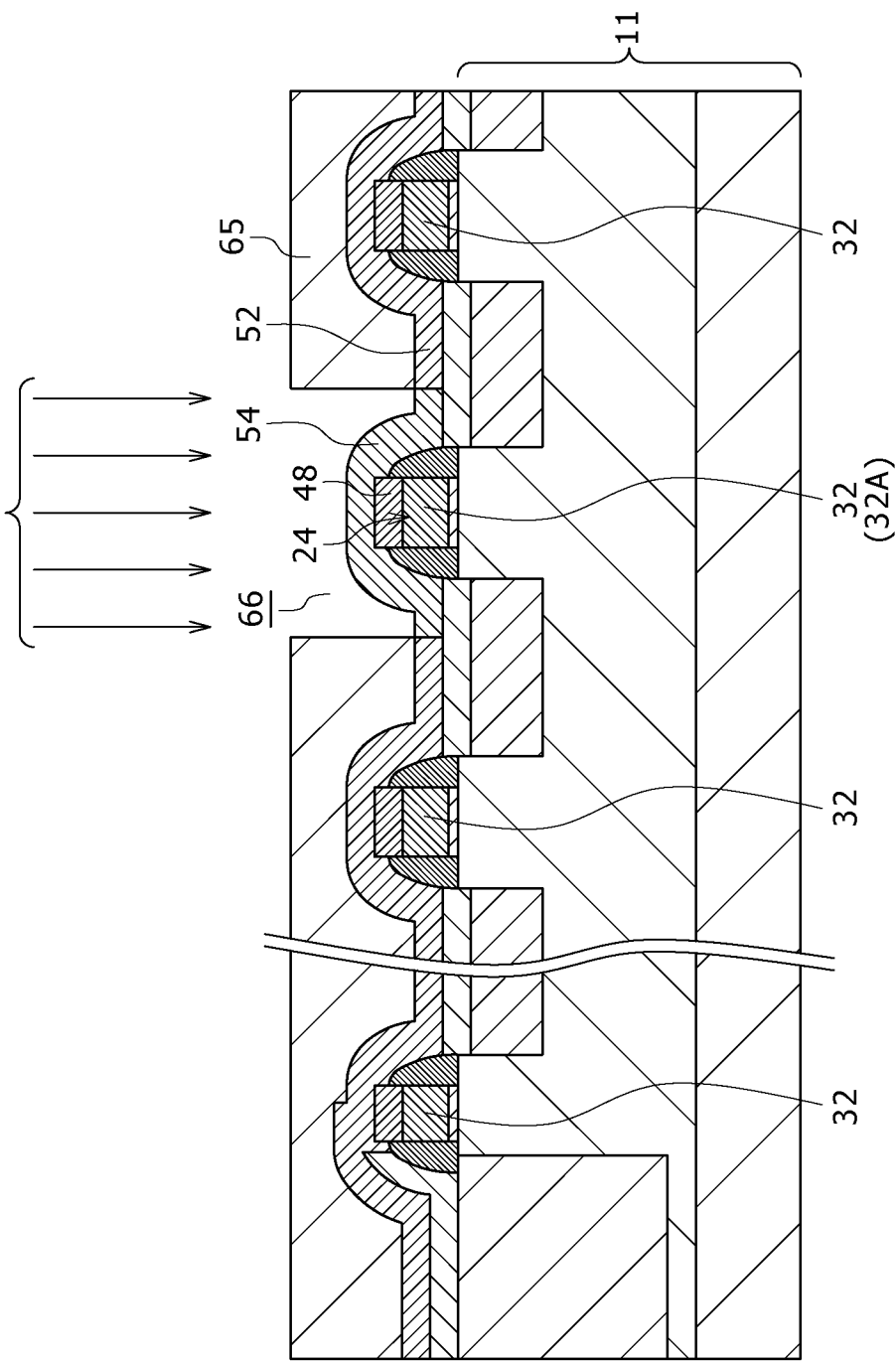
FIG. 10 is a manufacturing process sectional view of an embodiment (fourth embodiment) of a method of manufacturing a solid-state image pickup device according to the present invention.

As shown in FIG. 10, as described above with reference to FIGS. 7A to 7E, an etching stopper film 52 to cover gate electrodes 32 and the like is formed by a silicon nitride film, for example, on a semiconductor substrate 11.

Next, a resist film 65 is formed on the etching stopper film 52 by ordinary resist coating techniques. A resist for KrF, for example, is used as the resist film 65. Next, the resist film 65 over the amplifying transistor 24 is removed to form an opening 66 by ordinary lithography techniques.

Next, nitrogen ions are implanted into the etching stopper film 52 on the amplifying transistor 24 with the resist film 65 used as an ion implantation mask.

As a result, the etching stopper film 52 on the amplifying transistor 24 is densified and increased in film density, so that the etching stopper film 52 on only the amplifying transistor 24 can be made to be a compressive stress film 54 having a compressive stress.

As conditions for the ion implantation, nitrogen ions were used as an ion species, a dose thereof was set to $5 \times 10^{14}$, and acceleration energy was set to 5 keV. The conditions are an example, and the ion implantation conditions can be changed as appropriate depending on film density, film thickness and the like at the time of formation of the etching stopper film 52.

Thereafter the resist film 65 is removed. Then a rapid heating process (RTA process) was performed to form Si—N bonds, whereby film density was increased. Conditions for the thermal process at this time were 850° C. and 20 s as an example. The thermal process conditions can be changed as appropriate in a range in which film density can be increased by forming Si—N bonds.

When nitrogen ions are implanted into a silicon nitride film as described above, silicon-hydrogen bonds (Si—H bonds) in the silicon nitride film are broken, and there occur excess silicon bonds. Then, by the thermal process, bonds of ion-implanted nitrogen are bonded to the silicon bonds to form stronger silicon-nitrogen bonds (Si—N bonds) than the silicon-hydrogen bonds. Thereby the silicon nitride film is densified. In general, densifying the silicon nitride film increases compressive stress in the film.

Thus, it is desirable to introduce sufficient nitrogen so that the Si—H groups in the etching stopper film 52 are changed to Si—N bonds.

In the case of the manufacturing method according to the fourth embodiment, as in the manufacturing method according to the first embodiment, the compressive stress film 54 having a compressive stress is formed on the amplifying transistor 24. Therefore, a local tensile stress applied to a channel region of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

Further, the compressive stress film 54 can also be made to function as an etching stopper film. Therefore the compressive stress film 54 can function as an etching stopper for preventing excessive etching of the silicide layer 48 as a foundation when a connecting hole for connecting a contact part as a part of wiring connected to the floating diffusion 26, for example, is formed in a part above the gate electrode 32A of the amplifying transistor 24.

Another manufacturing method (fifth embodiment) in which the side walls 33 formed on the side walls of the gate electrodes in the first to fourth embodiments are formed by a compressive stress film having a compressive stress will next be described with reference to a manufacturing process sectional view of FIG. 11.

Figure 11:
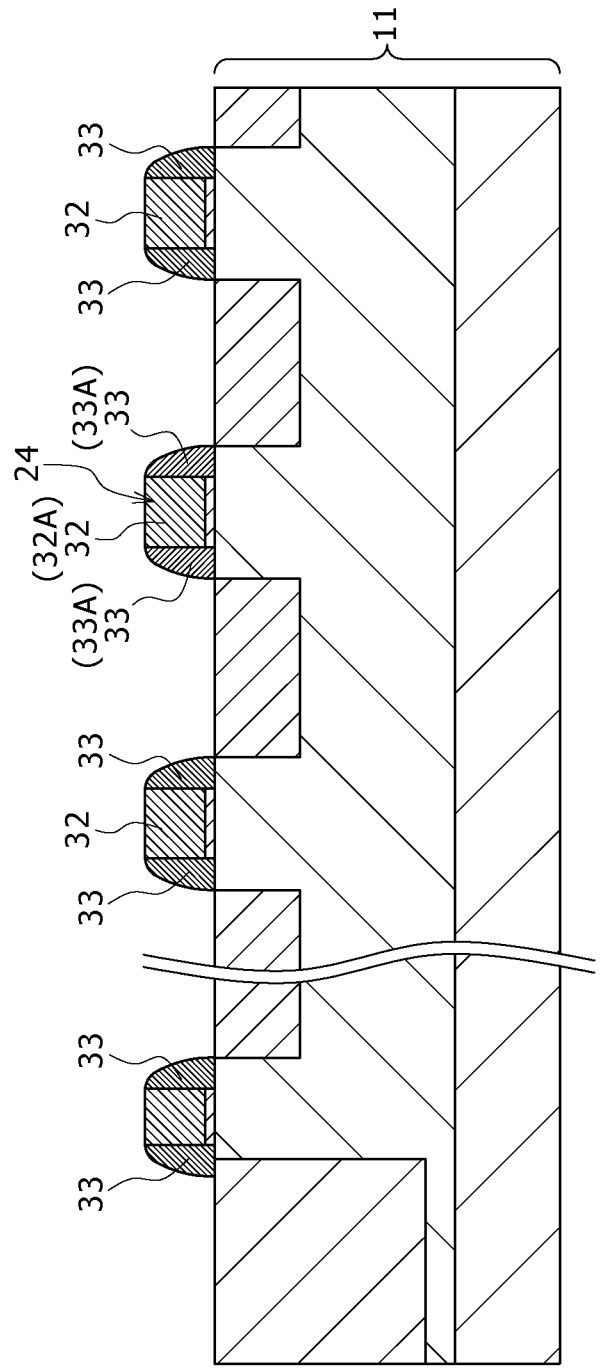
FIG. 11 is a manufacturing process sectional view of an embodiment (fifth embodiment) of a method of manufacturing a solid-state image pickup device according to the present invention.

As shown in FIG. 11, as described above with reference to FIGS. 7A to 7C, side walls 33 are formed on side walls of each gate electrode on a semiconductor substrate 11.

At this time, for example, a silicon nitride film for forming the side walls covering the gate electrodes 32 is formed, and then the silicon nitride film in a region where an amplifying transistor 24 is formed is irradiated with an electron beam. Thereby the silicon nitride film of a part irradiated with the electron beam is densified to become a compressive stress film having a compressive stress.

Alternatively, after a silicon nitride film for forming the side walls covering the gate electrodes 32 is formed, a resist mask (not shown) having an opening above the amplifying transistor 24 is formed, and nitrogen ions are implanted into the silicon nitride film on the region where the amplifying transistor 24 is formed. Thereby the silicon nitride film of a part into which the nitrogen ions are implanted is densified to become a compressive stress film having a compressive stress.

Reasons for an effect of densification of the silicon nitride film are similar to those of densification of the silicon nitride film in the third embodiment and the fourth embodiment.

Thereafter the silicon nitride film for forming the side walls is subjected to whole-surface etching back to form the side walls 33 on the side walls of each gate electrode. In this case, the side walls 33 (33A) formed on the side walls of the gate electrodes 32 (32A) of the amplifying transistor 24 are a film having a compressive stress.

A process after the formation of the side walls 33 is similar to a process after the formation of the side walls 33 in the manufacturing methods according to the first to fourth embodiments. Thus, though not shown, the compressive stress film 54 having a compressive stress is formed on the amplifying transistor 24 as in the manufacturing methods according to the first to fourth embodiments.

In the case of the manufacturing method according to the fifth embodiment, as in the manufacturing methods according to the first to fourth embodiments, the compressive stress film 54 having a compressive stress is formed on the amplifying transistor 24. Therefore, a local tensile stress applied to a channel region of the amplifying transistor 24 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

Further, because the side walls 33A of the amplifying transistor 24 also have a compressive stress, a greater compressive stress can be applied to the channel region. Therefore an increase in variation in 1/f noise of the amplifying transistor 24 can be suppressed more.

Next, there is a case of forming an element isolation region of an STI (Shallow Trench Isolation) structure next to the amplifying transistor 24 in the first to fifth embodiments. This manufacturing method (sixth embodiment) will be described with reference to manufacturing process sectional views of FIGS. 12A to 12E.

As shown in FIG. 12A, as described above with reference to FIGS. 7A to 7C, as in the first to fifth embodiments, a well region 12 is formed in a semiconductor substrate 11. Thereafter a silicon oxide film, for example, is formed as a sacrifice oxide film 91 on the semiconductor substrate 11, and then a silicon nitride film 92 is formed.

Next, the silicon nitride film 92 and the sacrifice oxide film 91 on a region for forming the element isolation region of the STI structure are removed to form an opening 93 by ordinary lithography techniques and etching techniques.

Figure 12B:
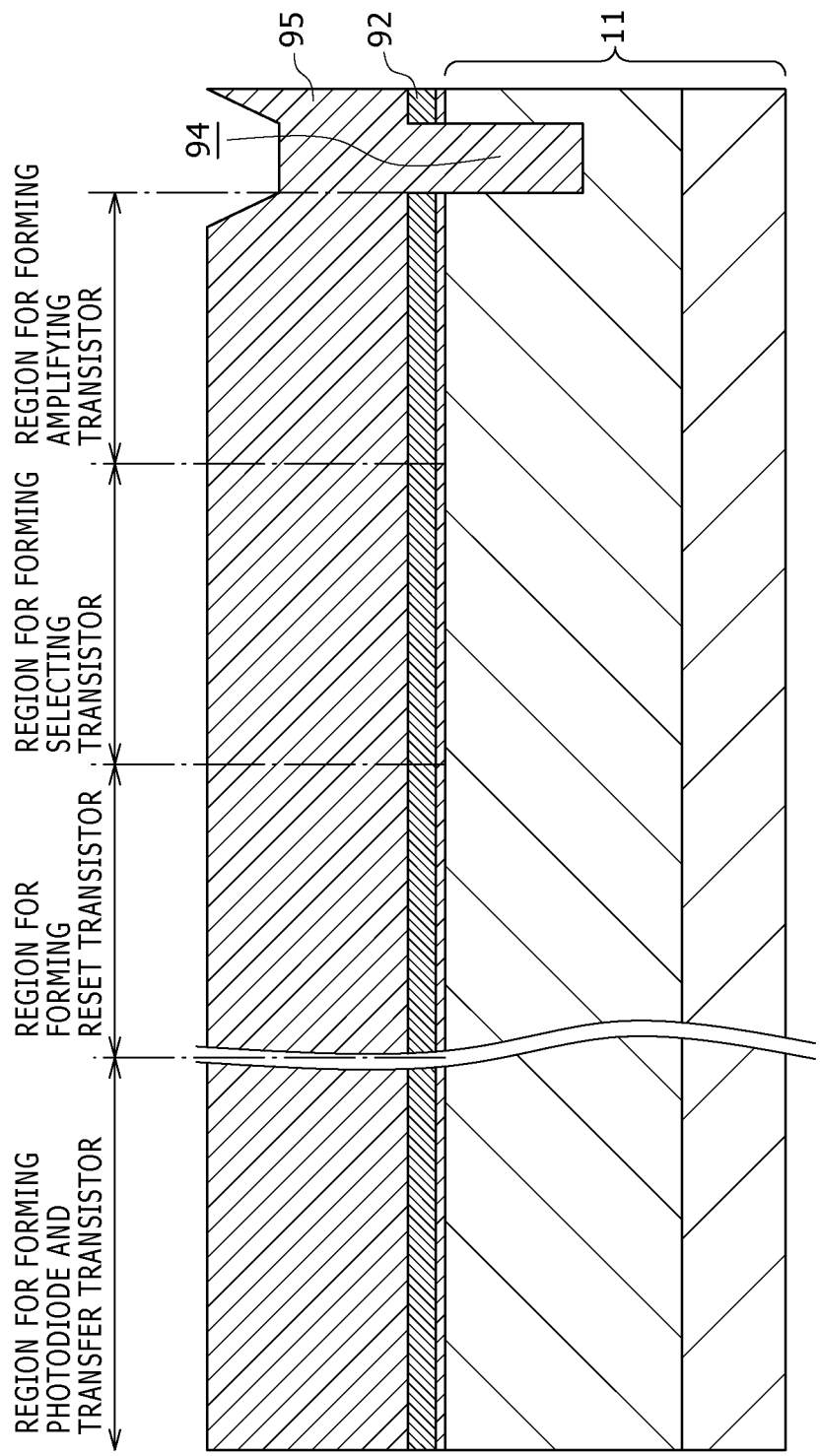

Next, as shown in FIG. 12B, the semiconductor substrate 11 is etched with the silicon nitride film 92 used as an etching mask to form an element isolation groove 94. This element isolation groove 94 for example isolates regions for forming pixel transistors such as a region for forming a reset transistor, a region for forming a selecting transistor, and a region for forming an amplifying transistor from for example a region for forming a photodiode and a transfer transistor and a region (not shown) for forming a peripheral circuit.

In this case, a manufacturing method for a constitution provided with the selecting transistor between a pixel power supply Vdd and one diffusion layer of the amplifying transistor in the first to fifth embodiments will be described as an example. Therefore, the amplifying transistor is formed at an end of the regions for forming the pixel transistors.

Next, an insulating film 95 is formed on the silicon nitride film 92 so as to fill in the element isolation groove 94. The insulating film 95 is formed by a silicon oxide film, for example. In addition, before filling the insulating film 95, a silicon oxide film (not shown) may be formed by oxidizing the inside of the element isolation groove 94 by a thermal oxidation method, for example.

Next, as shown in FIG. 12C, the insulating film 95 is polished and removed by chemical mechanical polishing (CMP) until the silicon nitride film 92 is exposed. At this time, the silicon nitride film 92 serves as a polishing stopper. As a result, an element isolation region 96 of the STI structure made of the insulating film 95 is formed inside the element isolation groove 94.

Figure 12D:
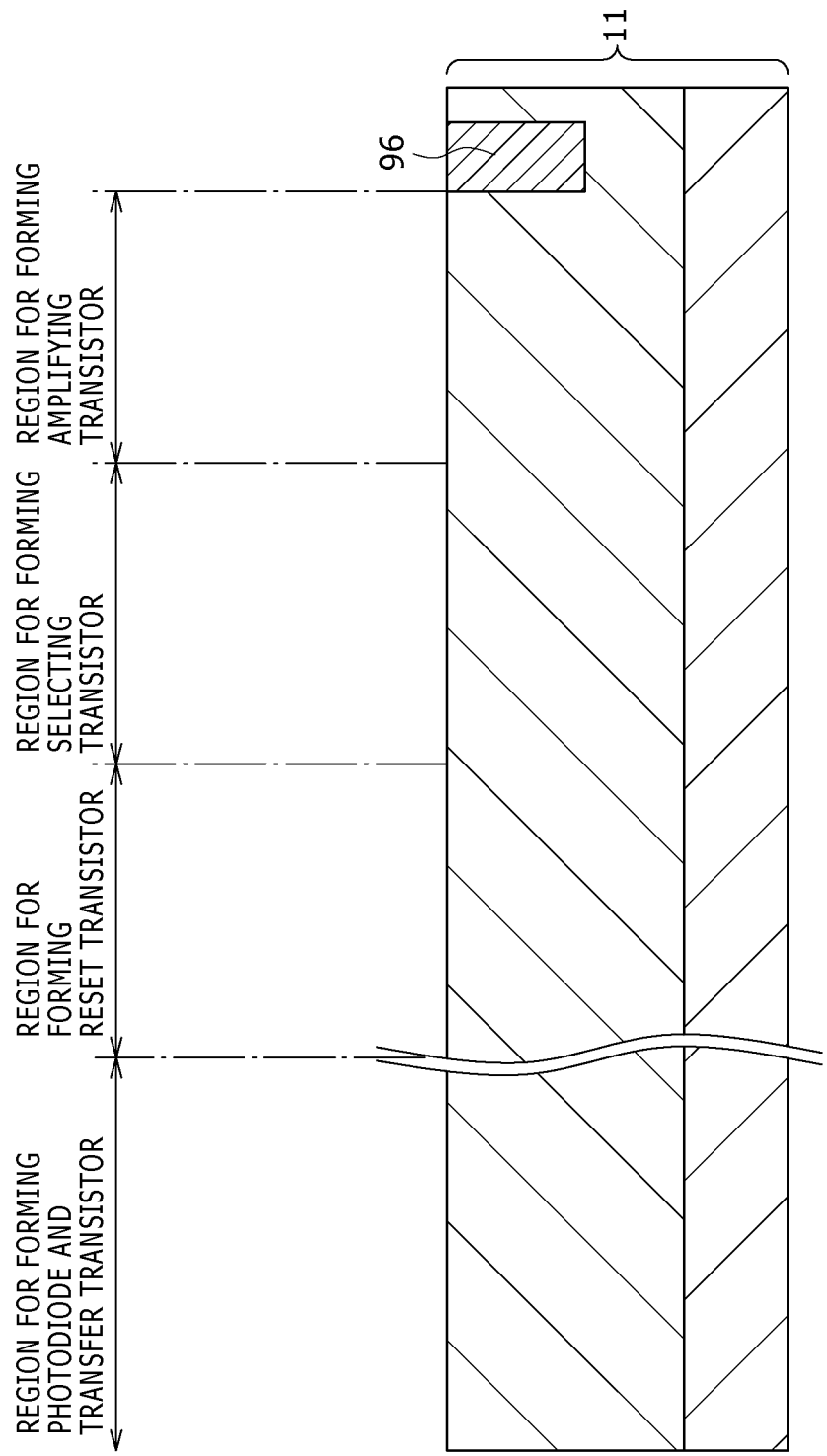

Thereafter, the silicon nitride film 92 is removed by wet etching using a hot phosphoric acid. Further, the sacrifice oxide film 91 is removed by hydrofluoric acid or the like. As a result, as shown in FIG. 12D, the element isolation region 96 of the STI structure is formed in the semiconductor substrate 11.

Thereafter a process similar to that of the first to fifth embodiments is performed. Incidentally, in the present embodiment, the selecting transistor is formed between the pixel power supply Vdd and one diffusion layer of the amplifying transistor in the first to fifth embodiments. In the following, a case where the element isolation region 96 according to the present embodiment is applied to the constitution of the first embodiment will be described as an example.

Figure 12E:
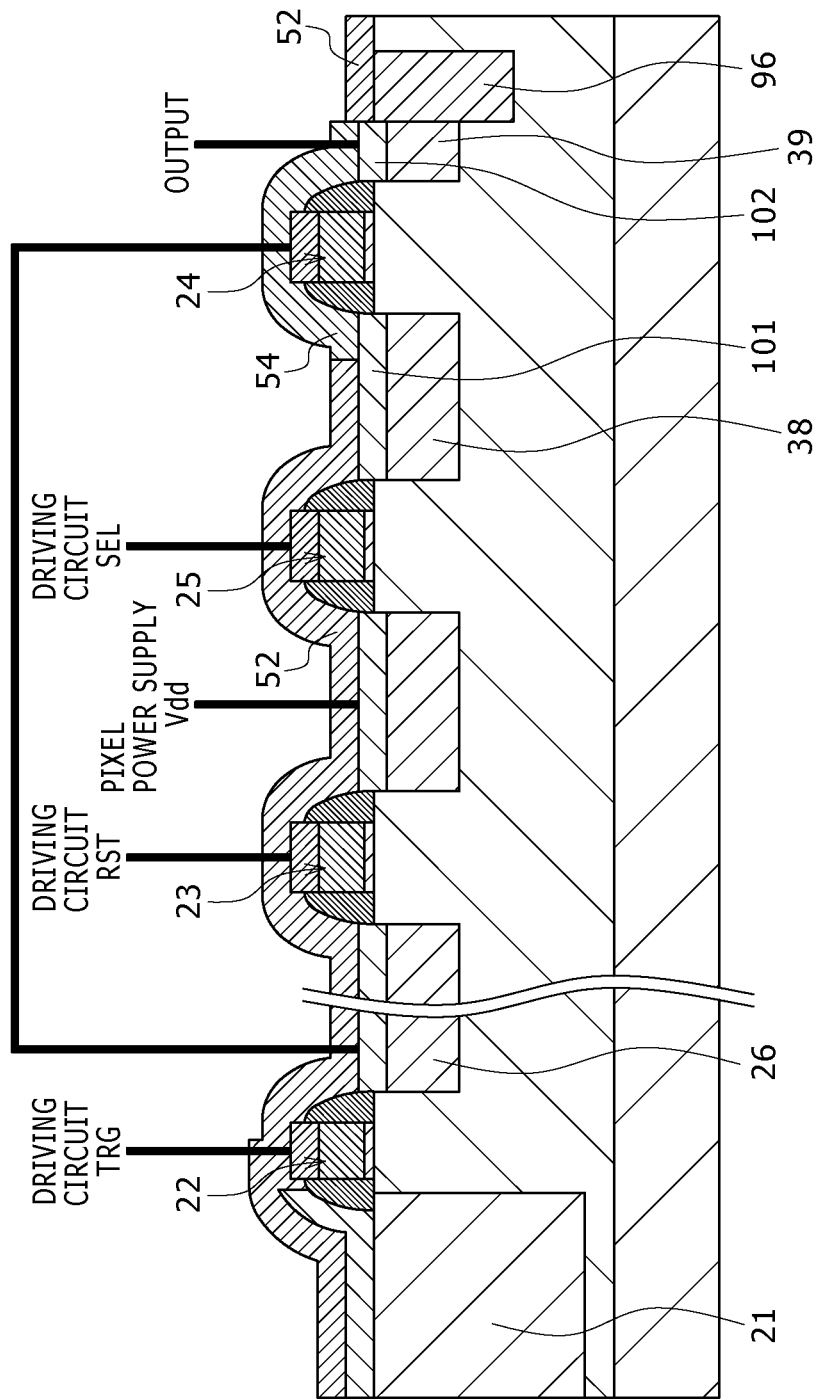

As a result, as shown in FIG. 12E, a photodiode 21, a reset transistor 23, an amplifying transistor 24, a selecting transistor 25, a floating diffusion 26 and the like are formed in the semiconductor substrate 11. In this case, one diffusion layer 39 of the amplifying transistor 24 is disposed and formed so as to be adjacent to the element isolation region 96 of the STI structure.

Then, an etching stopper film 52 is formed so as to cover the photodiode 21, the reset transistor 23, the selecting transistor 25, the floating diffusion 26 and the like, and a compressive stress film 54 having a compressive stress is formed so as to cover the amplifying transistor 24.

In the above-described sixth embodiment, the well region 12 may be formed after the element isolation region 96 of the STI structure is formed in the semiconductor substrate 11, and thereafter the photodiode 21, the reset transistor 23, the amplifying transistor 24, the selecting transistor 25, the floating diffusion 26 and the like may be formed by a process similar to the above-described process. Alternatively, the element isolation region 96 of the STI structure may be formed after the well region 12 is formed in the semiconductor substrate 11, and thereafter the photodiode 21, the reset transistor 23, the amplifying transistor 24, the selecting transistor 25, the floating diffusion 26 and the like may be formed by a process similar to the above-described process.

In the case of the manufacturing method according to the sixth embodiment, as in the manufacturing methods according to the first to fifth embodiments, the compressive stress film 54 having a compressive stress is formed on the amplifying transistor 24. Therefore, a local tensile stress applied to a channel region of the amplifying transistor 24 which stress is caused by silicide layers 101 and 102 formed on the diffusion layers 38 and 39 of the amplifying transistor 24 and the element isolation region 96 is relieved by the compressive stress of the compressive stress film 54, so that an increase in variation in 1/f noise of the amplifying transistor 24 can be suppressed.

Thus, because lowering of an SN ratio can be suppressed, there is an advantage of being able to obtain excellent image quality by achieving a high SN ratio.

Figure 13:
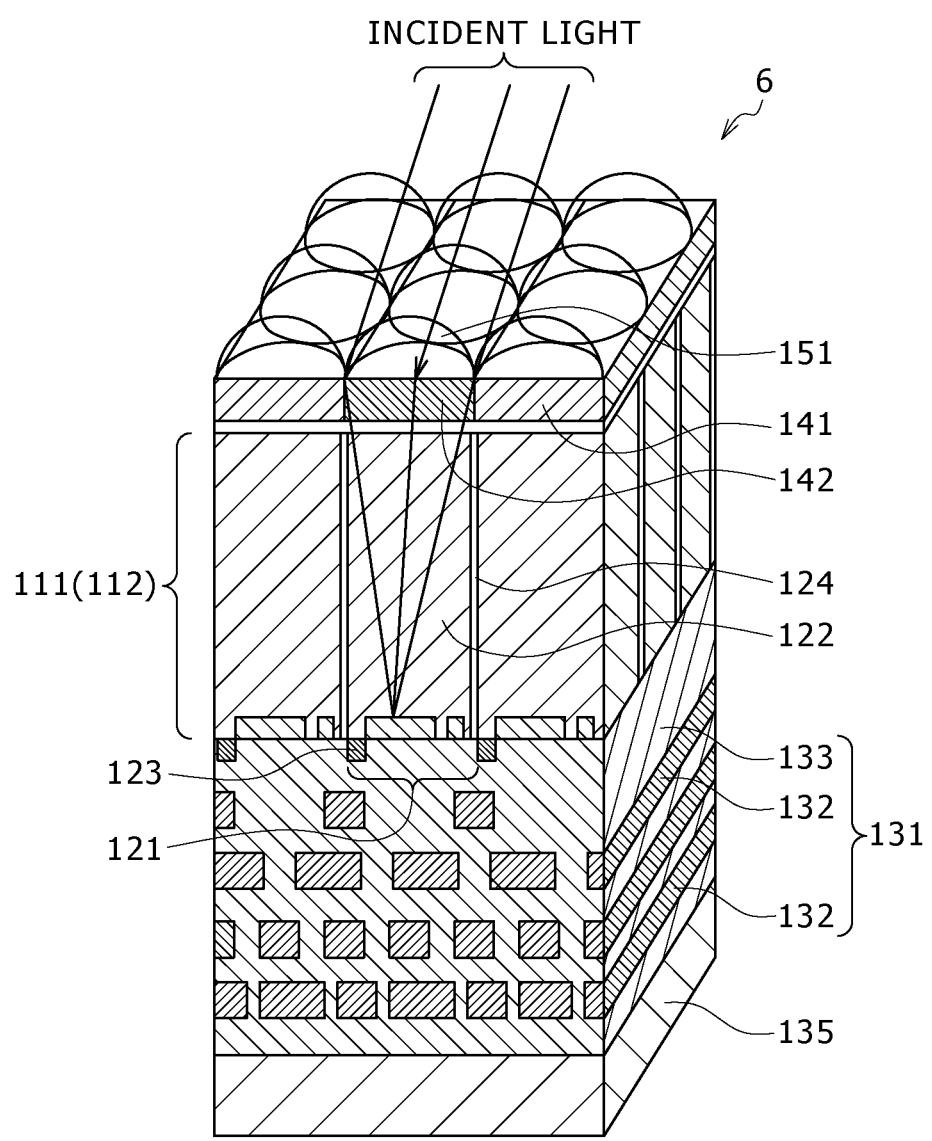
FIG. 13 is a schematic perspective sectional view of a CMOS image sensor of a back-surface irradiation type.
Figure 15C:
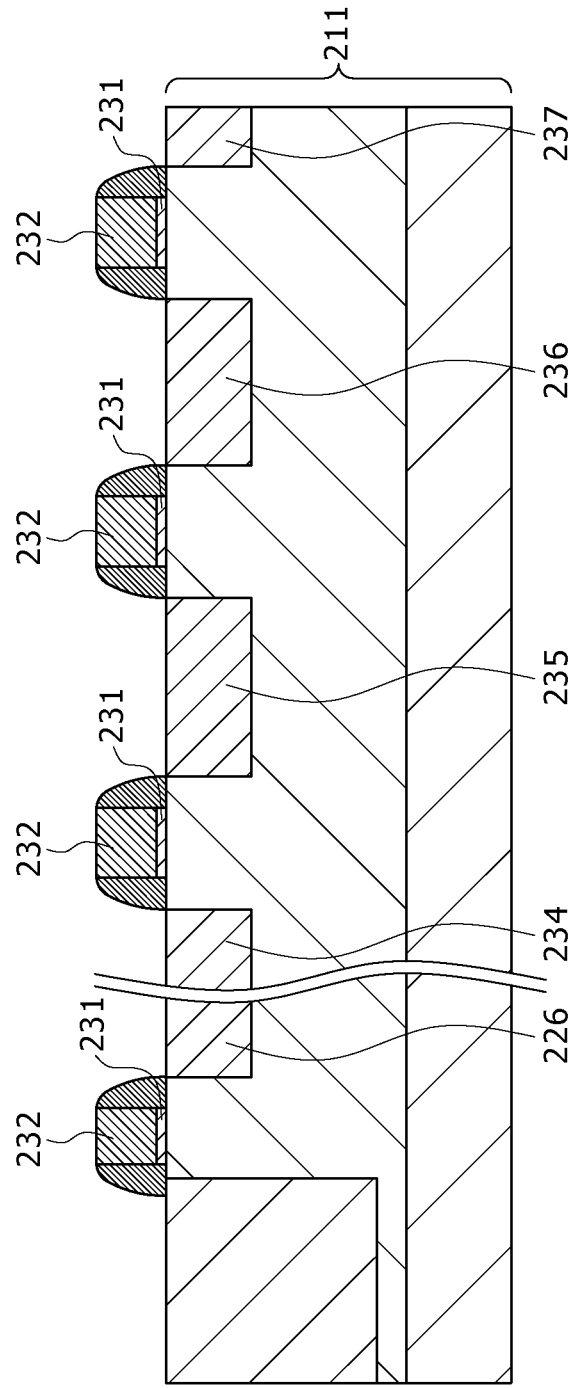
Figure 15E:
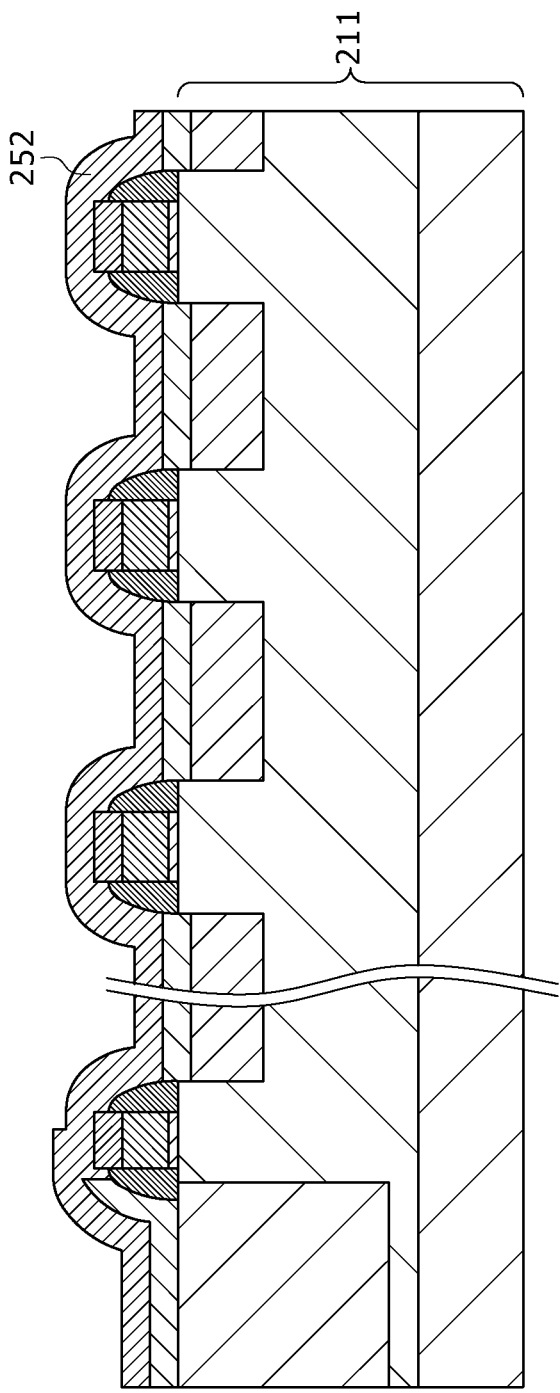

While the above description has been made of a CMOS sensor of a so-called front-surface irradiation type, a compressive stress film according to an embodiment of the present invention is similarly applicable to an amplifying transistor in a CMOS sensor of a back-surface irradiation type shown in FIG. 13, for example.

As shown in FIG. 13, a plurality of pixel sections 121 having for example a pixel transistor group 123 (a part thereof is shown in the drawing) of an photoelectric conversion section (for example a photodiode) 122 for converting incident light into an electric signal, a transfer transistor, a reset transistor, an amplifying transistor, a selecting transistor and the like are formed in an active layer 112 formed by a semiconductor substrate 111. A silicon substrate, for example, is used as the semiconductor substrate 111. Further, a signal processing section (not shown) for processing a signal charge read from each photoelectric conversion section 122 is formed.

An element isolation region 124 is formed in a part of the periphery of the pixel sections 121, for example between pixel sections 121 in a row direction or a column direction, for example.

In addition, a wiring layer 131 is formed on the front surface side of the semiconductor substrate 111 (lower side of the semiconductor substrate 111 in the drawing) where the photoelectric conversion sections 122 are formed. The wiring layer 131 is composed of wiring 132 and an insulating film 133 covering the wiring 132. A supporting substrate 135 is formed on the wiring layer 131. The supporting substrate 135 is formed by a silicon substrate, for example.

Further, in a solid-state image pickup device 6 of FIG. 13, a planarizing film 141 having an optical transparency is formed on the back surface side of the semiconductor substrate 111. A color filter layer 142 is formed on the planarizing film 141 (upper surface side in the drawing). In addition, a condensing lens 151 for condensing incident light on each photoelectric conversion section 122 is formed on the color filter layer 142.

A compressive stress film according to an embodiment of the present invention can be applied on the amplifying transistor of the pixel transistor group 123.

Also in the CMOS image sensor of the back-surface irradiation type, 1/f noise is suppressed by applying a compressive stress film according to an embodiment of the present invention to a constitution in which tensile stress is applied to a channel region of the amplifying transistor formed by an NMOS transistor.

As described above, in the embodiments of the present invention, the compressive stress film 54 on the amplifying transistor 24 is formed so that compressive stress is applied to the channel region of the amplifying transistor 24 in the pixel transistor group of the CMOS type image sensor. Generally, tensile stress is applied to an NMOS transistor in order to increase mobility of a channel region of the NMOS transistor. However, the embodiments of the present invention prevents lowering of an SN ratio by suppressing an increase in variation in 1/f noise of the amplifying transistor 24, and makes it possible to obtain excellent image quality by achieving a high SN ratio. In addition, in the embodiments, the compressive stress film 54 is formed only on the amplifying transistor 24, and therefore the mobility of other transistors is not degraded.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state image pickup device, said solid-state image pickup device including, in a semiconductor substrate, a photoelectric conversion section configured to convert incident light into a signal charge, a transfer transistor configured to read the signal charge from said photoelectric conversion section and transfer the signal charge, and an amplifying transistor configured to amplify the signal charge read by said transfer transistor, said method comprising the steps of:

forming, after forming said amplifying transistor in said semiconductor substrate, an insulating film on said semiconductor substrate, and then forming an opening part in said insulating film on said amplifying transistor;

forming a compressive stress film covering said amplifying transistor and having a compressive stress on said insulating film; and leaving said compressive stress film in said opening part on said amplifying transistor and removing said compressive stress film on regions other than said opening part.

2. The method of manufacturing a solid-state image pickup device according to claim 1, wherein a step of forming said amplifying transistor includes the steps of:

forming a gate electrode on said semiconductor substrate via a gate insulating film;

forming a low-concentration diffusion layer in said semiconductor substrate on both sides of said gate electrode;

forming a side wall having a compressive stress on side walls of said gate electrode; and forming a high-concentration diffusion layer having a higher impurity concentration than said low-concentration diffusion layer in said semiconductor substrate on both sides of said gate electrode via said low-concentration diffusion layer on a side of said gate electrode.

3. The method of manufacturing a solid-state image pickup device according to claim 2, wherein said side wall is formed by a compressive stress film having a compressive stress.

* * * * *